US009691998B2

(12) United States Patent
Lay et al.

(10) Patent No.: US 9,691,998 B2
(45) Date of Patent: Jun. 27, 2017

(54) SINGLE-WALLED CARBON NANOTUBES/QUANTUM DOT HYBRID STRUCTURES AND METHODS OF MAKING AND USE OF THE HYBRID STRUCTURES

(71) Applicant: University of Georgia Research Foundation, Inc., Athens, GA (US)

(72) Inventors: Marcus D. Lay, Bishop, GA (US); Pornnipa Vichchulada, Winder, GA (US); Darya Asheghali, Athens, GA (US)

(73) Assignee: UNIVERSITY OF GEORGIA RESEARCH FOUNDATION, INC., Athens, GA (US)

( * ) Notice: Subject to any disclaimer, the term of this patent is extended or adjusted under 35 U.S.C. 154(b) by 112 days.

(21) Appl. No.: 14/097,530

(22) Filed: Dec. 5, 2013

(65) Prior Publication Data

US 2014/0151636 A1 Jun. 5, 2014
US 2017/0117494 A9 Apr. 27, 2017

Related U.S. Application Data

(63) Continuation-in-part of application No. 13/868,381, filed on Apr. 23, 2013, now Pat. No. 9,190,185.

(60) Provisional application No. 61/733,473, filed on Dec. 5, 2012, provisional application No. 61/636,885, filed on Apr. 23, 2012.

(51) Int. Cl.
*B32B 9/00* (2006.01)
*H01L 51/05* (2006.01)
*H01L 51/10* (2006.01)
*H01L 51/00* (2006.01)

(52) U.S. Cl.
CPC ........ *H01L 51/0566* (2013.01); *H01L 51/105* (2013.01); *H01L 51/0048* (2013.01); *H01L 51/0049* (2013.01); *H01L 51/0545* (2013.01)

(58) Field of Classification Search
CPC . H01L 51/005; H01L 51/0566; H01L 51/105; B82Y 10/00; B82Y 30/00; B82Y 40/00; C01B 31/026; B01J 23/881; B01J 23/882
USPC ...................... 136/252; 257/40, 76; 428/408
See application file for complete search history.

(56) References Cited

U.S. PATENT DOCUMENTS

2005/0056828 A1* 3/2005 Wada et al. ..................... 257/40
2009/0114273 A1* 5/2009 Kamat ........................... 136/252
2015/0097193 A1* 4/2015 Yap .................................. 257/76

OTHER PUBLICATIONS

Lee M and Yen C. (2010) Low Leakage and High-k Liquid Phase Deposited TiO2 and SiO2ÕTiO2 Films on NH4 . . . 2S-Treated GaAs. Electrochemical and Solid-State Letters, 13 (10)G87-G90.
Asaka, K. et al. Modification of interface structure and contact resistance between a carbon nanotube and a gold electrode by local meltingAppl. Surf. Sci. 2011, 257, 2850.
Balog, R. et al. Atomic Hydrogen Adsorbate Structures on Graphene. J. Am. Chem. Soc. 2009, 131, 8744.

(Continued)

*Primary Examiner* — Khanh Tuan Nguyen
(74) *Attorney, Agent, or Firm* — Thomas|Horstemeyer, LLP

(57) ABSTRACT

Briefly described, embodiments of the present disclosure relate to structures including single-walled carbon nanotube/quantum dot networks, devices including the structures, and methods of making devices including the single-walled carbon nanotube/quantum dot networks.

24 Claims, 15 Drawing Sheets

(56) References Cited

OTHER PUBLICATIONS

Banus, M. D. et al. Electrical and Magnetic Properties of Tio and VO. J. Phys. Rev. B 1972, 5, 2775.
Bard, A. J.; Faulkner, L. R. Electrochemical Methods, Fundamentals and Applications; 2nd ed.; John Wiley & Sons: New York, 2001.
Basame, S. B.; White, H. S. Scanning Electrochemical Microscopy of Metal/ Metal Oxide Electrodes. Analysis of Spatially Localized Electron-Transfer Reactions during Oxide Growth. Anal. Chem. 1999, 71, 3166.
Basu, M. et al. Fabrication and Functionalization of CuO for Tuning Superhydrophobic Thin Film and Cotton Wool. J. Phys. Chem. C 2011, 115, 20953.
Bhatt, et al., "Bulk Purification and Deposition Methods for Selective Enrichment in High Aspect ratio Single-Walled Carbon Nanotubes," Journal of the American Chemical Society; 2012, 134, 9352-9361.
Bockrath, M. et al. Resonant Electron Scattering by Defects in Single-Walled Carbon Nanotubes. Science 2001, 291, 283.
Boxley, C. J. et al. Nanoscale Imaging of the Electronic Conductivity of the Native Oxide Film on Titanium Using Conducting Atomic Force Microscopy J. Phys. Chem. B 2003, 107, 9677.
Byon, H. R.; Choi, H. C. Network Single-Walled Carbon Nanotube-Field Effect Transistors (SWNT-FETs) with Increased Schottky Contact Area for Highly Sensitive Biosensor Applications. J. Am. Chem. Soc. 2006, 128, 2188.
Caballero-Briones, F. et al. Direct Observation of the Valence Band Edge by in Situ ECSTM-ECTS in p-Type $Cu_2O$ Layers Prepared by Copper Anodization. J. Phys. Chem. C 2009, 113, 1028.
Casillas, N. et al. Pitting Corrosion of Titanium. J. Electrochem. Soc. 1994, 141, 636.
Chen, Z. H. et al. The Role of Metal-Nanotube Contact in the Performance of Carbon Nanotube Field-Effect Transistors. Nano Lett. 2005, 5, 1497.
Chow, B. Y. et al. Perfecting Imperfect "Monolayers": Removal of Siloxane Multilayers by $CO_2$ Snow Treatment 2005, 21, 4782.
Day, T. M. et al. Electrochemical and Conductivity Measurements of Single-Wall Carbon Nanotube Network Electrodes. J. Am. Chem. Soc. 2004, 126, 16724.
Deng, S. et al. Reduced Graphene Oxide Conjugated $Cu_2O$ Nanowire Mesocrystals for High-Performance $NO_2$ Gas SensorJ. Am. Chem. Soc. 2012, 134, 4905.
Dudin, P. V. et al. Electrochemistry at Nanoscale Electrodes: Individual Single-Walled Carbon Nanotubes (SWNTs) and SWNT-Templated Metal Nanowires Acs Nano 2011, 5, 10017.
Emery, S. B. et al. Voltammetric and amperometric analyses of electrochemical nucleation: electrodeposition of copper on nickel and tantalum J. Electroanal. Chem. 2004, 568, 121.
Fan, Y. W. et al. Identifying and counting point defects in carbon nanotubes. Nat. Mater. 2005, 4, 906.
Freitag, M. et al. Imaging of the Schottky Barriers and Charge Depletion in Carbon Nanotube Transistors Nano Lett. 2007, 7, 2037.
Fuhrer, M. S. et al. Crossed Nanotube Junctions. Science 2000, 288, 494.
Heller, I. et al. Influence of Electrolyte Composition on Liquid-Gated Carbon Nanotube and Graphene Transistors. J. Am. Chem. Soc. 2010, 132, 17149.
Hong, G. et al. Direct Growth of Semiconducting Single-Walled Carbon Nanotube Array. J. Am. Chem. Soc. 2009, 131, 14642.
Horcas, I. et al. WSXM: A software for scanning probe microscopy and a tool for nanotechnology. Rev. Sci. Instrum. 2007, 78.
Hu, L. et al. Carbon Nanotube Thin Films: Fabrication, Properties, and Applications. Chem. Rev. 2010, 110, 5790.
Huang, W.-C. et al. Synthesis of $Cu_2O$ Nanocrystals from Cubic to Rhombic Dodecahedral Structures and Their Comparative Photocatalytic Activity. J. Am. Chem. Soc. 2012, 134, 1261.
Jacobsen, C. J. H.; Bøggild, P. Nano Lett. 2002, 3, 47.

Kocabas, C. et al. Experimental and Theoretical Studies of Transport through Large Scale, Partially Aligned Arrays of Single-Walled Carbon Nanotubes in Thin Film Type Transistors. Nano Lett. 2007, 7, 1195.
Laitinen, H. A.; Kolthoff, I. M. A Study of Diffusion Processes by Electrolysis with Microelectrodes. J. Am. Chem. Soc. 1939, 61, 3344.
Li, C. W.; Kanan, M. W. $CO_2$ Reduction at Low Overpotential on Cu Electrodes Resulting from the Reduction of Thick $Cu_2O$ Films. J. Am. Chem. Soc. 2012, 134, 7231.
Li, E. Y.; Marzari, N. Improving the Electrical Conductivity of Carbon Nanotube Networks: A First-Principles Study. Acs Nano 2011, 5, 9726.
Liu, R. et al. Shape Control in Epitaxial Electrodeposition: $Cu_2O$ Nanocubes on InP(001). Chem. Mater. 2003, 15, 4882.
Lu, C. G.; An, L.; Fu, Q. A.; Liu, J.; Zhang, H.; Murduck, J. Appl. Phys. Lett. 2006, 88, 133501 http://scitation.aip.org/content/aip/journal/apl/88/13/10.1063/1.2190707.
Madsen, D. N.; Mølhave, K.; Mateiu, R.; Rasmussen, A. M.; Brorson, M.; Jacobsen, C. J. H.; Bøggild, P. Soldering of Nanotubes onto Microelectrodes P. Nano Lett. 2002, 3, 47.
McShane, C. M.; Choi, K.-S. Photocurrent Enhancement of n-Type $Cu_2O$ Electrodes Achieved by Controlling Dendritic Branching Growth. J. Am. Chem. Soc. 2009, 131, 2561.
Nirmalraj, P. N. et al. Electrical Connectivity in Single-Walled Carbon Nanotube Networks. J. Nano Lett. 2009, 9, 3890.
Oskam, G.; Searson, P. C. Electrochemical nucleation and growth of gold on silicon. Surf. Sci. 2000, 446, 103.
Palacin, T. et al. Efficient Functionalization of Carbon Nanotubes with Porphyrin Dendrons via Click ChemistryJ. Am. Chem. Soc. 2009, 131, 15394.
Rao, C. N. R.; Subba Rao, G. V. Electrical Conduction in Metal Oxides. Phys. Status Solidi 1970, 1, 597.
Rodriguez-Manzo, J. A. et al. Heterojunctions between Metals and Carbon Nanotubes as Ultimate Nanocontacts. Proc. Natl. Acad. Sci. USA 2009, 106, 4591.
Rouhi, N. et al. High-Performance Semiconducting Nanotube Inks: Progress and Prospects. Acs Nano 2011, 5, 8471.
Sangwan, V. K. et al. Fundamental Performance Limits of Carbon Nanotube Thin-Film Transistors Achieved Using Hybrid Molecular Dielectrics Acs Nano 2012, 6, 7480.
Savio, A. K. P. D. et al. Tunable $TiO_2$ (anatase and rutile) materials manufactured by mechanical means. Ceram. Int. 2012, 38, 3529.
Scharifker, B.; Hills, G. Theoretical and Experimental Studies of Multiple Nucleation. Electrochim. Acta 1983, 28, 879.
Schwab, M. G. et al. Structurally Defined Graphene Nanoribbons with High Lateral Extension. J. Am. Chem. Soc. 2012, 134, 18169.
So, H. M. et al. Selective Suppression of Conductance in Metallic Carbon Nanotubes. J. Am. Chem. Soc. 2007, 129, 4866.
Taychatanapat, T. et al. Imaging Electromigration during the Formation of Break Junctions Nano Lett. 2007, 7, 652.
Vandenberg, E. T. et al. Structure of 3-Aminopropyl Triethoxy Silane on Silicon Oxide. J. Colloid Interface Sci. 1991, 147, 103.
Vichchulada, P. et al. Macroscopic Electrical Properties of Ordered Single-Walled Carbon Nanotube Networks. J. Phys. Chem. C 2010, 114, 12490.
Vichchulada, P. et al. Sonication Power for Length Control of Single-Walled Carbon Nanotubes in Aqueous Suspensions Used for 2-Dimensional Network Formation. ACS Appl. Mater. Interfaces 2010, 2, 467.
Walter, E. C. et al. Noble and Coinage Metal Nanowires by Electrochemical Step Edge Decoration. J. Phys. Chem. B 2002, 106, 11407.
Wu, S. et al. Electrochemical deposition of Cl-doped n-type $Cu_2O$ on reduced graphene oxide electrodes. J. Mater. Chem. 2011, 21, 3467.
Yan, X. et al. Synthesis of Large, Stable Colloidal Graphene Quantum Dots with Tunable Size. J. Am. Chem. Soc. 2010, 132, 5944.
Yang, F. et al. Identification of 5-7 Defects in a Copper Oxide Surface. J. Am. Chem. Soc. 2011, 133, 11474.

(56) References Cited

OTHER PUBLICATIONS

Yang, M. H. et al. Carbon nanotube Schottky diode and directionally dependent field-effect transistor using asymmetrical contacts Appl. Phys. Lett. 2005, 87, 3.

Yang, X. et al. Wet-Chemistry-Assisted Nanotube-Substitution Reaction for High-Efficiency and Bulk-Quantity Synthesis of Boron- and Nitrogen-Codoped Single-Walled Carbon Nanotubes J. Am. Chem. Soc. 2011, 133, 13216.

Yang, Z. et al. Birch Reduction of Graphite. Edge and Interior Functionalization by Hydrogen. J. Am. Chem. Soc. 2012, 134, 18689.

Yuhas, B. D.; Yang, P. Nanowire-Based All-Oxide Solar Cells. J. Am. Chem. Soc. 2009, 131, 3756.

Zhang, L. et al. Optical Characterizations and Electronic Devices of Nearly Pure (10,5). Single-Walled Carbon Nanotubes J. Am. Chem. Soc. 2009, 131, 2454.

Zhang, L. et al. Assessment of Chemically Separated Carbon Nanotubes for Nanoelectronics. J. Am. Chem. Soc. 2008, 130, 2686.

Zhang, Q. et al. Percolation in networks of aligned SWNTs formed with laminar flow deposition. J. Mater. Sci. 2009, 44, 1206.

Zhang, Q. et al. Length, Bundle, and Density Gradients in Spin Cast Single-Walled Carbon Nanotube Networks. J. Phys. Chem. C 2010, 114, 16292.

Zhang, Q. et al. Reducing electrical resistance in single-walled carbon nanotube networks: effect of the location of metal contacts and low-temperature annealing J. Mat. Sci. 2012, 47, 6812.

Zhang, Y. et al. Metal coating on suspended carbon nanotubes and its implication to metal-tube interaction. J. Chem. Phys. Lett. 2000, 331, 35.

Zhang, Y. et al. Heterostructures of Single-Walled Carbon Nanotubes and Carbide Nanorods. Science 1999, 285, 1719.

Zhao, L. et al. Interrupted growth and photoelectrochemistry of $Cu_2O$ and Cu particles on $TiO_2$. Electrochim. Acta 2012, 80, 354.

Zhou, W. et al. General Rules for Selective Growth of Enriched Semiconducting Single Walled Carbon Nanotubes with Water Vapor as in Situ Etchant J. Am. Chem. Soc. 2012, 134, 14019.

Zhou, X. J. et al. Band Structure, Phonon Scattering, and the Performance Limit of Single-Walled Carbon Nanotube Transistors. Phys. Rev. Lett. 2005, 95.

\* cited by examiner

SINGLE-WALLED CARBON NANOTUBES/QUANTUM DOT HYBRID STRUCTURES AND METHODS OF MAKING AND USE OF THE HYBRID STRUCTURES

CROSS-REFERENCE TO RELATED APPLICATION

This application is a Continuation-in-part of application Ser. No. 13/868,381 entitled "Bulk Purification and Deposition Methods for Selective Enrichment in High Aspect Ratio Single-Walled Carbon Nanotubes," filed on Apr. 23, 2013, which claimed priority to U.S. provisional patent application of the same title having Ser. No. 61/636,885 filed on Apr. 23, 2012, both of which are entirely incorporated herein by reference. This application also claims priority to and the benefit of U.S. provisional patent application entitled "Single-walled Carbon Nanotubes/Quantum Dot Hybrid Structures and Methods of Making and Use of the Hybrid Structures", Ser. No. 61/733,473 filed Dec. 5, 2012 and incorporated herein by reference in its entirety

STATEMENT REGARDING FEDERALLY SPONSORED RESEARCH OR DEVELOPMENT

This invention was made with Government support under grant numbers DMR-0906564 and CHE-1038015, awarded by the National Science Foundation. The Government has certain rights in the invention.

BACKGROUND

Pristine, individual single-walled carbon nanotubes (SWNTs) have excellent electrical properties that exceed those of the semiconductors and metals currently used in microchip manufacturing. Depending on chirality and diameter, individual SWNTs may be semiconductive (s-SWNT) or metallic (m-SWNT). For s-SWNTs, the electron mobility is orders of magnitude greater than that for Si and GaAs.[1] While in m-SWNTs, the mean free path for an electron can exceed 2 μm, making them prime candidates for use as electrical interconnects. Additionally, since conduction occurs via an extended π bonding network, they are not susceptible to electromigration, which results from the movement of metal nuclei in response to momentum transfer from electrons during current flow. This is an increasingly significant failure mechanism as device structures decrease in size.[2] Therefore, both varieties of SWNTs have great potential in many microelectronics applications.

However, significant challenges remain for developing manufacturable electronic materials that make use of an individual SWNT as the active component, as one of the most notable characteristics of SWNTs is their polydispersity: for bulk growth processes, $\frac{1}{3}^{rd}$ are m-SWNTs, while the other $\frac{2}{3}^{rd}$ are s-SWNTs. Approaches to dealing with this problem include attempts at selective growth of s-SWNTs,[3-5] or post growth solution processing to remove m-SWNTs.[6-9] However, for s-SWNTs, the band gap varies with diameter and chirality from near 0 to ~1.8 eV. Therefore, even after the separation of SWNTs based on their type of electrical conductivity, widely varying band gaps remain in the semiconductive portion, causing semiconductor device structures formed from individual SWNTs to be highly irreproducible. Additionally, the current drive through an individual SWNT is limited to the nA range, while higher current drives are needed by modern electronic devices. Further, device structures based on individual SWNTs will require significant advances in the ability to control the length, orientation, and location of SWNTs during their growth or deposition.

Therefore, 2-D SWNT networks represent a potential route to the widespread use of SWNTs. In a 2-D array, the nanotube density and alignment largely dictate performance. Also, multiple SWNTs connected in parallel provide orders of magnitude more current than an individual SWNT. Further, unlike Si-based electronic materials, SWNT networks have great potential in transparent, lightweight, and flexible electronic materials, especially as new aqueous suspension-based deposition methods are developed for the polymer substrates used in these applications.

A drawback to the use of SWNT networks is their greatly reduced performance, relative to that observed for single-SWNT systems. Several factors contribute to this reduced performance. First, inter-device precision is low in field-effect transistors (FETs) based on SWNT networks in part because changes in the Schottky barrier height between s-SWNTs in direct contact with the metal source and drain electrodes dictate much of the response to the gate voltage $(V_g)$,[10-12] leaving the semiconductive channel largely unaffected. Also, the OFF-state current of SWNT network-based FETs is limited by the presence of the metallic pathways provided by m-SWNTs and small band gap s-SWNTs, since they are largely unaffected by $V_g$. These effects combine to increase the OFF-state source/drain leakage currents in SWNT-based devices, greatly reducing their energy efficiency. Second, due to the inter-SWNT tunnel junctions that must be traversed in a network, their electron mobility decreases up to three orders of magnitude, relative to that for individual nanotubes.[1,13] Also, the poor attractive forces between metals and the π bonding network in nanotubes results in non-ohmic contacts, increasing contact R and thereby reducing the level of ON-state current efficiency that can be achieved at a given source/drain voltage, reducing the ON-state/OFF-state current ratio $(I_{on}/I_{off})$.

SUMMARY

Briefly described, the present disclosure provides networks of single-walled carbon nanotubes (SWCNTs) and quantum dots, structures and devices including the SWCNT/QD networks, field effect transistors (FETS) including the SWCNT/QD networks, methods of making structures and devices including the SWCNT/QD networks, and methods of increasing the ON-STATE/OFF-STATE ratio of an FET having a network of SWCNTs.

In embodiments, the present disclosure provides structures including a substrate, a network of SWCNTs, and a plurality of quantum dots on the network of SWCNT, where the quantum dots are in contact with the SWCNTs in the network forming a network of SWCNTs and quantum dots (SWCNT/QD network). The present disclosure also includes devices including the SWCNT/QD network.

Embodiments of field effect transistor (FET) of the present disclosure include a substrate, an electrode, a network of SWCNTs, and a plurality quantum dots disposed on the network of SWCNTs, where the quantum dots are in contact with the SWCNTs in the network.

Methods of making a device according to the present disclosure include providing a substrate, forming a network of SWCNTs on the substrate, and depositing a plurality of semiconductive quantum dots on the network of SWCNTs. In embodiments of the methods, forming a network of SWCNTs on the substrate includes the steps of contacting the substrate with a composition comprising SWCNTs, drying the substrate in a unidirectional stream of nitrogen (N$_2$), rinsing the surface with water, and repeating these steps for a number of cycles until a network of SWCNTs is formed on the substrate.

Embodiments of methods of the present disclosure for increasing the ON-STATE/OFF-STATE ratio of a field effect transistor (FET) having a network of SWCNTs, include depositing a plurality of semiconductive quantum dots on the network of SWCNTs, such that the quantum dots act as Vg-tunable Schottky contacts reducing OFF-STATE of the FET in a Vg range +/−5V.

Other systems, methods, features, and advantages of the present disclosure will be or become apparent to one with skill in the art upon examination of the following drawings and detailed description. It is intended that all such additional systems, methods, features, and advantages be included within this description, and be within the scope of the present disclosure.

BRIEF DESCRIPTION OF THE DRAWINGS

The disclosure can be better understood with reference to the following drawings, which are discussed in the description and examples below. The components in the drawings are not necessarily to scale, emphasis instead being placed upon clearly illustrating the principles of the present disclosure.

FIG. 1A is a series of schematic drawings of a bustrate, with electrode, adhesion layer, and SWNT array. FIG. 1B illustrates representative cyclic voltammograms of the three surfaces showing enhanced reductive currents for the TiO$_x$/silane/SWNT surfaces relative to the TiO$_x$/silane samples, indicating that the SWNTs facilitated the reduction of Cu; FIG. 1C illustrates i vs. t traces obtained at a constant potential of about 0.10 V vs. Ag/AgCl, for a total of about 16.7 mC of charge, showing displayed a sigmoidal shape for the TiO$_x$/silane/SWNT samples, indicative of enhanced instantaneous and progressive nucleation processes; and FIG. 1D illustrates Raman microscopy revealing that the Cu species varied with the nanoparticle size.

FIG. 4A (8×8 μm) shows that the deposition of a low density network of SWNTs provided nucleation points for Cu$_2$O along the conductive sidewalls of the nanotubes, as observed from the greatly increased density of nanoparticles; FIG. 4B is a high resolution AFM image showing that the Cu$_2$O nanoclusters also provide low-R connections between nearby SWNTs, presenting an opportunity to decrease the interfacial R at SWNT/metal electrode interfaces.

FIG. 7A revealed that partially aligned SWNTs allowed for reduced R and greater improvements in $I_{on}/I_{off}$ than (FIG. 7B) orthogonally oriented SWNTs, as the increase in $I_{on}/I_{off}$ observed was about 205- and 8-fold, respectively. Insets: two-terminal i/V curves obtained at $V_g$=0 V showed that a greater reduction in R was achieved for "crossbar" networks.

DETAILED DESCRIPTION

Figure 1A:
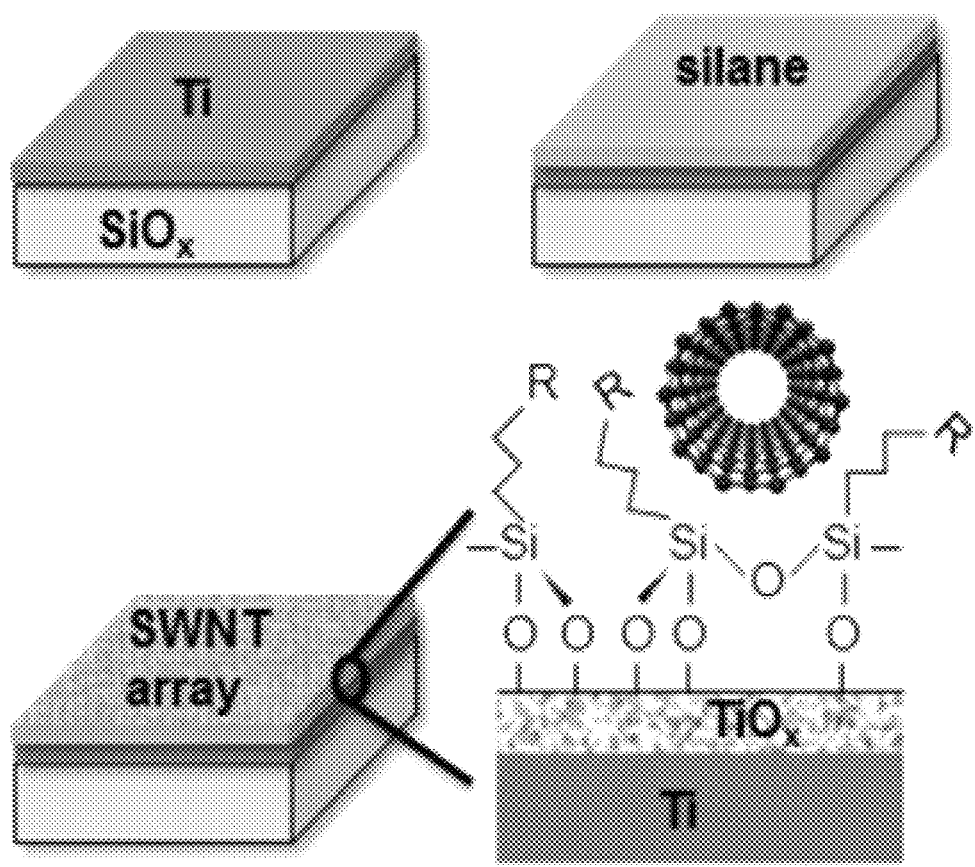
FIGS. 1A-1D illustrate electrochemical samples including Ti/TiO$_x$, TiO$_x$/silane, or TiOx/silane/SWNT samples of equal surface area.

The details of some embodiments of the present disclosure are set forth in the description below. Other features, objects, and advantages of the present disclosure will be apparent to one of skill in the art upon examination of the following description, drawings, examples and claims. It is intended that all such additional systems, methods, features, and advantages be included within this description, be within the scope of the present disclosure, and be protected by the accompanying claims.

Before the present disclosure is described in greater detail, it is to be understood that this disclosure is not limited to particular embodiments described, as such may, of course, vary. It is also to be understood that the terminology used herein is for the purpose of describing particular embodiments only, and is not intended to be limiting, since the scope of the present disclosure will be limited only by the appended claims.

Where a range of values is provided, it is understood that each intervening value, to the tenth of the unit of the lower limit (unless the context clearly dictates otherwise), between the upper and lower limit of that range, and any other stated or intervening value in that stated range, is encompassed within the disclosure. The upper and lower limits of these smaller ranges may independently be included in the smaller ranges and are also encompassed within the disclosure, subject to any specifically excluded limit in the stated range. Where the stated range includes one or both of the limits, ranges excluding either or both of those included limits are also included in the disclosure.

Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, the preferred methods and materials are now described.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that the present disclosure is not entitled to antedate such publication by virtue of prior disclosure. Further, the dates of publication provided could be different from the actual publication dates that may need to be independently confirmed.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure. Any recited method can be carried out in the order of events recited or in any other order that is logically possible.

Embodiments of the present disclosure will employ, unless otherwise indicated, techniques of nanotechnology, organic chemistry, electrical engineering, and the like, which are within the skill of the art. Such techniques are explained fully in the literature.

It must be noted that, as used in the specification and the appended claims, the singular forms "a," "an," and "the" include plural referents unless the context clearly dictates otherwise. For example, the term "a cell" includes a plurality of cells, including mixtures thereof.

In this specification and in the claims that follow, reference will be made to a number of terms that shall be defined to have the following meanings unless a contrary intention is apparent.

DEFINITIONS

In describing and claiming the disclosed subject matter, the following terminology will be used in accordance with the definitions set forth below.

As used herein, the term "SWCNT network" refers to a substantially two-dimensional arrangement of single-walled carbon nanotubes (SWCNTs), where at least a portion of the SWCNTs are directly or indirectly (e.g., via a bridging structure) contacting each other to form an interconnected structure. The term "SWCNT/QD network" refers to a substantially two-dimensional arrangement of SWCNTs and quantum dots, where the quantum dots are distributed within the arrangement of SWCNTs such the quantum dots are in contact with at least a portion of the surfaces of the SWCNTs. Thus, in some places, the QDs form a link or bridge between adjacent SWCNTs.

The term "aligned" as used herein with respect to SWCNTs indicates that the SWCNTs are oriented, lengthwise, in generally the same direction. While "substantially aligned" does not require that 100% of the SWCNTs in a group be completely parallel to each other, it indicates that most of the SWCNTs in a group (e.g., more than about 50%, more than about 60%, more than about 75%, more than about 90%, and so on) are not crossing each other. "Partially aligned" refers to a grouping of SWCNTs where some of the SWCNTs in a group (e.g., more than about 30%, more than about 40%, and so on) are not crossing each other.

The term "orthogonally oriented" in reference to SWCNTs in the present disclosure, refers to an orientation of SWCNTs where the SWCNTs are not parallel and are in a generally crossbar formation (e.g., crossing each other). "Substantially orthogonally oriented" indicates that more than about 50% and up to about 100% of the SWCNTs in a grouping are crossing each other, whereas "partially aligned" indicates that some but not all of the SWCNTs in a group (e.g., more than about 30%, more than about 40%, and so forth) are crossing each other. In embodiments, "orthogonally oriented" SWCNTs are crossing each other at an angle of greater than about 30 degrees.

As used in the present disclosure, the term "unbundled" in reference to SWCNTs refers to SWCNTs that are not clumped together, such that at least some individual SWCNTs can be identified. Unbundled groups of SWCNTs are substantially in a single layer, rather than piled on top of one another.

Discussion:

In accordance with the purpose(s) of the present disclosure, as embodied and broadly described herein, embodiments of the present disclosure, in one aspect, relate to compositions and devices including single walled carbon nanotubes (SWCNTs) and quantum dots, methods of making the compositions and devices including the SWCNTs and quantum dots, and methods of using the compositions and devices.

Embodiments of the present disclosure include networks of single walled carbon nanotubes (SWCNTs) having a plurality of quantum dots in contact with at least a portion of the surfaces of the SWCNTs in the network and compositions and structures including such SWCNT/quantum dot hybrid networks (SWCNT/QD networks).

In embodiments, the quantum dot (QD) is a nanoparticle or nanocluster of a semiconductor material, such as but not limited to, Cu or other transition metal having semiconductor characteristics. In embodiments the quantum dots are nanoparticles/nanoclusters of a Cu oxide such as, but not limited to, $CuO$, $Cu_2O$, and combinations thereof. In embodiments, the nanoparticles/nanoclusters of semiconductor material have a size (e.g., longest dimension, such as length) less than about 20 nm. In embodiments, the nanoparticles/nanoclusters have a size of about 1 nm to about 20 nm. In embodiments they have a size of about 1 nm to about 10 nm.

In embodiments of the compositions of the present disclosure including the SWCNT/QD networks, the SWCNTs are unbundled. In some embodiments, the SWCNTs are at least partially aligned in the network. In other embodiments, the SWCNTs are in a "crossbar" orientation. In the crossbar networks, the SWCNTs can be at least partially orthogonally distributed within the network (e.g., at least some of the SWCNTs are at angles to each other, some may even be perpendicular, near-perpendicular, or crossing each other). In contrast, in networks where the SWCNTs are at least partially aligned, at least a detectable portion of the SWCNTs are aligned substantially in the same direction with each other (e.g., partially or substantially parallel). In the methods, networks, and devices of the present disclosure the SWCNTs (prior to addition of the QDs) may be made and/or deposited on a substrate via conventional methods known to those of skill in the art. In other embodiments, the SWCNTs may be made and/or deposited according to methods described in the examples below and described in additional details in co-pending U.S. application Ser. No. 13/868,381 and also described Bhatt, et al., ("Bulk Purification and Deposition Methods for Selective Enrichment in High Aspect ratio Single-Walled Carbon Nanotubes," Journal of the American Chemical Society; 2012, 134, 9352-

9361), both of which are incorporated by reference herein. The above cited references also describe methods of producing networks of unbundled SWCNTs with controllable density and controllable alignment (e.g., aligned, orthogonally distributed, etc.) which are incorporated by reference in the present disclosure.

In embodiments of the present disclosure the network of SWCNTs can include semiconductive SWCNTs, metallic SWCNTs, and a combination thereof. Methods of producing SWCNTs typically produce a mixture of semiconductive and metallic SWCNTs, which can then be separated by methods known to those of skill in the art. However, the compositions, structures, devices and methods of the present disclosure provide networks of SWCNTs in which a combination of both semiconductive and metallic SWCNTs can be used, thus, eliminating or reducing the need for the separation step in some embodiments.

In embodiments of compositions and devices including the SWCNT/QD hybrid networks of the present disclosure, the network may be disposed on a substrate. Thus, some embodiments of structures of the present disclosure include a substrate, a network of SWCNTs, and a plurality of quantum dots on the network of SWCNT, where the quantum dots are in contact with at least a portion of the surfaces of the SWCNTs in the network. In some embodiments the substrate is made of glass, a silicon-based material, a native oxide metal, a mica, a polymer, Au, or a combination of these materials. In embodiments, the substrate is selected from glass, Au, $Si/SiO_2$, $Si/SiO_x$ (e.g., x=1, x=2), $TiO_x$ (e.g., x=1, x=2), a native oxide metal, a mica, a polymer, or a combination of these.

In some embodiments, structures of the present disclosure also include an adhesion layer between the substrate and the network of SWCNTs to facilitate the SWCNTs adherence to the substrate. In embodiments the adhesion layer is a self-assembled monolayer. In an embodiment, the monolayer is selected from: a silane, a thiol, a phosphate, a sulfide, a disulfide, a phosphonate, and a combination thereof (e.g., thiols on Au, phosphates on glass or metal oxide surfaces). The monolayer allows the use of surfaces that SWNTs would not normally stick to. In embodiments, the adhesion layer is disposed on the substrate by depositing a silanization agent. In embodiments, the adhesion layer is a silane layer or other silanization coating.

In another embodiment, the structures and devices of the present disclosure also include at least one electrode on the surface of the substrate. In embodiments the at least one electrode is selected from: Ti, Al, Ta, Ni, Fe, and a combination thereof. In an embodiment, the electrodes are deposited before or after the network formation. The suspension deposition method of the present disclosure is compatible with any substrate or surface (e.g., electrode) that is terminated by functional groups that serve as an adhesive layer for SWNTs to stick to (e.g., a metal with a native oxide will work to adhere the SWNTs via a silane or phosphate, and other metals will work with thiols). Adhesion layers, as described above can also be deposited on the substrate and/or electrode to facilitate adhesion of the SWNTs.

The compositions and structures including the SWCNT networks and quantum dots of the present disclosure can be used in various devices. In embodiments, the networks can be incorporated in to field effect transistor (FET) which can be used in various other electrical devices. In embodiments, a FET of the present disclosure includes a substrate, an electrode, a network of SWCNTs, and a plurality quantum dots on the network of SWCNTs, where the quantum dots are in contact with at least a portion of the surfaces of the SWCNTs in the network. In embodiments, the FETs of the present disclosure can also include an adhesion layer as described above.

In embodiments the adhesion layer is disposed on the substrate and the electrodes to assist in forming the network of SWCNTs on the substrate and/or electrodes. The substrate and SWCNT/QD networks can be as described above. In embodiments, the electrode is a metal electrode, such as, but not limited to, Ti, Al, Ta, Ni, Fe, and combinations of these metals. In embodiments, the electrode is etched or otherwise disposed on the substrate. In embodiments of an FET of the present disclosure, the electrode is made of titanium oxide. In embodiments the titanium oxide is selected from $TiO_2$, $Ti_2O_3$, and titanium oxides with a Ti/O ratio of about 0.8 to about 1.7.

The present disclosure also includes devices including the networks, compositions, structures, and field effect transistors of the present disclosure described herein.

The present disclosure also includes methods of making the compositions and devices of the present disclosure. In embodiments, methods of the present disclosure include providing a substrate, as described above, optionally having at least one electrode on the substrate. Some embodiments also include depositing an adhesion layer on the substrate and/or electrode(s), if useful for increasing adhesion of the SWCNTs to the substrate/electrode(s). In embodiments, depositing the adhesion layer includes exposing the substrate and/or electrodes to a silanization agent. Methods of the disclosure further include forming a network of SWCNTs on the adhesion layers according to known methods or according to the methods discussed in the examples below or in related U.S. application Ser. No. 13/868,381. Then, methods of the present disclosure include depositing a plurality of semiconductive quantum dots on the network of SWCNTs. In embodiments, the SWCNT network is in electrical communication with the electrodes. In embodiments, depositing a plurality of semiconductive quantum dots on the network of SWCNTs includes depositing the quantum dots by electrodeposition or chemical vapor deposition, as described in greater detail in the representative example below. In embodiments where the quantum dots are a copper oxide, the quantum dots can deposited by electrodeposition of $Cu^{2+}$ on the substrate/SWCNT network.

As described in greater detail in the example below and related application, U.S. application Ser. No. 13/868,381, in embodiments of the present disclosure, the step of forming a network of SWCNTs on the substrate includes contacting the substrate with a composition comprising SWCNTs. In embodiments, the methods include purifying and depositing SWNT networks by preparing a substrate, preparing a suspension of SWNTs, and depositing the SWNT suspension, where the deposition method provides control over the density and alignment of SWNTs and prevents (e.g., substantially prevents (e.g., not only 100% prevention)) the SWNTs from forming bundles during deposition. The suspension processing method of the present disclosure purifies SWNT soot and separates long SWNTs from shorter ones, all without using oxidizing methods that damage the SWNTs and increase their resistance. In addition, depositing the SWNT suspension via a method that provides control over the density and alignment of SWNTs, while preventing them from forming bundles provides much better performance of the SWNT networks in field-effect transistors.

Embodiments of the present disclosure include a method where preparing the suspension of SWNTs includes dispersing unmodified SWNT soot in a solution of sodium dodecyl sulfate (SDS) via probe ultrasonication to form a suspension, centrifuging the suspension for about 45 to about 90 minutes at about 18,000 g, removing at least a portion of the supernatant, and repeating the centrifugation at least one time. In an embodiment, purifying the SWNTS without oxidizing acids or vapors produces high aspect ratio SWNTs, where the high aspect ratio SWNTs include low defects and exhibit decreased electrical resistance (R). The purification and enrichment process of the present disclosure works to purify SWNT that has a nominal purity of down to 40 to 60% SWNTs. Purifying without oxidizing acids or vapors allows the product to be high aspect ratio SWNTs (oxidation shortens them) that conduct extremely well since they have low defects and longer tubes allow for fewer inter-SWNT junctions that increase resistance.

In embodiments, after formation of the suspension of SWNTs, the method includes, depositing the suspension of SWNT to the substrate, drying the substrate in a unidirectional stream of nitrogen ($N_2$), rinsing the surface with water, and repeating the above steps for a number of cycles until a network of SWCNTs is formed on the substrate. The orientation of the SWCNTs can be controlled by the direction of the nitrogen stream during the drying steps. In embodiments where a network of aligned (e.g., partially or substantially aligned) SWCNTs is desired, the direction of nitrogen during drying is kept the same for each cycle to help align the SWCNTs to produce a network where the SWCNTs are partially or substantially aligned. When a crossbar network of SWCNTs is desired, the direction of the nitrogen stream during drying is changed between cycles (e.g., at perpendicular angles to the stream in the previous drying cycle, or at other non-aligned angles). Changing the direction of the nitrogen stream for each cycle (or a subset of total cycles) produces a network where the SWCNTs are oriented in a crossbar formation, such that the SWCNTs are at least partially orthogonally distributed.

In embodiments, methods of the present disclosure also include annealing the SWCNT coated substrate at about 100 to about 300° C. (e.g., about 300° C.). In an embodiment, the method further includes treating the coated substrate with a mild acid selected from: dilute nitric acid, dilute nitrous acid, and a combination thereof.

Embodiments of the present disclosure also include methods of reducing electrical resistance in SWNT networks. In embodiments, such methods include selective electrodeposition of conductive nanoparticles on SWNTs in a network, where the network is bridging metal electrodes, allowing deposition on the defect sites and sidewalls of the conductive SWNTs, while avoiding metal deposition around them, where the semiconductive character of the SWNTs is preserved and electrical resistance is reduced. In an embodiment, the extent to which resistance is reduced is controlled by control of the amount of electrochemical charge, which dictates the size of the conductive nanoparticles. In another embodiment, the extent to which resistance is reduced is controlled by changing the degree of alignment in the SWNTs that make up the network.

Embodiments of the present disclosure include a semiconducting single-walled carbon nanotube network where the on-off current ratio is increased by reducing resistance in the network. In an embodiment, the network is used in the formation of photovoltaic material. The present disclosure includes methods of increasing the ON-STATE/OFF-STATE ratio of a field effect transistor (FET) having a network of SWCNTs. In embodiments a plurality of semiconductive quantum dots can be deposited on the network of SWCNTs. The quantum dots act as Vg-tunable Schottky contacts reducing OFF-STATE of the FET in a Vg range +/−5V.

Field-effect transistors (FETs) including the SWCNT/QD networks of the present disclosure achieved significantly increased ON-STATE current. It is believed that the quantum dots improve the interfacial contacts between the SWCNTs and metal electrodes in the FETs because the quantum dots can act as valves that are easily tuned through the gat voltage (Vg). As described in the examples included below, this allowed unprecedented reduction in OFF-STATE in the Vg range +/−5V. Typical SWCNT network FETs require much greater Vg ranges due to insensitivity to Vg. The decrease in $I_{off}$ provided by the SWCNT/quantum not hybrid network reduces power dissipation due to parasitic leakage currents with an FET is in the OFF-state.

As described in greater detail in the Example below and in Asheghali, et al., ("Conversion of Metallic Single-Walled Carbon nanotube Networks to Semiconducting through Electrochemical Ornamentation," J. Am. Chem. Soc., 2013, 135, 7511-7522; hereby incorporated herein by reference), electrodeposition was used to form numerous Vg-tunable Schottky contacts, made of semiconductor quantum dots (e.g., Cu oxide nanoparticle/nanoclusters). The quantum dots were in contact with the surfaces of SWCNTs, e.g., touching the sidewalls of the SWCNTs, which enhanced the sensitivity of the entire network of SWCNTs to Vg. This reduced the source/drain leakage currents, such that up to a 211-fold increase in ON-STATE/OFF-STATE ratio was achieved. Due to these advantages, more dense networks of SWCNTs can be made, facilitating enhanced reproducibility through decreasing the number of isolated SWCNTs in a network. Devices including the FETs having the SWCNT/QD networks of the present disclosure will have improved performance. Also, notably, the methods of the present disclosure provide enhanced FET performance even for networks including mixtures of semiconductive and metallic SWNTs, thus eliminating or reducing the need for a separation state after nanotube formation.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure. Any recited method can be carried out in the order of events recited or in any other order that is logically possible.

The specific examples below are to be construed as merely illustrative, and not limitative of the remainder of the disclosure in any way whatsoever. Without further elaboration, it is believed that one skilled in the art can, based on the description herein, utilize the present disclosure to its fullest extent. All publications recited herein are hereby incorporated by reference in their entirety.

It should be emphasized that the embodiments of the present disclosure, particularly, any "preferred" embodiments, are merely possible examples of the implementations, merely set forth for a clear understanding of the principles of the disclosure. Many variations and modifications may be made to the above-described embodiment(s) of the disclosure without departing substantially from the spirit and principles of the disclosure. All such modifications and variations are intended to be included herein within the scope of this disclosure, and protected by the following embodiments.

The following examples are put forth so as to provide those of ordinary skill in the art with a complete disclosure and description of how to perform the methods and use the compositions and compounds disclosed and claimed herein.

Efforts have been made to ensure accuracy with respect to numbers (e.g., amounts, temperature, etc.), but some errors and deviations should be accounted for. Unless indicated otherwise, parts are parts by weight, temperature is in ° C., and pressure is at or near atmospheric. Standard temperature and pressure are defined as 20° C. and 1 atmosphere.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. In an embodiment, the term "about" can include traditional rounding according to measurement techniques and the numerical value. In addition, the phrase "about 'x' to 'y'" includes "about 'x' to about 'y'".

It should be emphasized that the above-described embodiments of the present disclosure are merely possible examples of implementations, and are merely set forth for a clear understanding of the principles of the disclosure. Many variations and modifications may be made to the above-described embodiments. All such modifications and variations are intended to be included herein within the scope of this disclosure and protected by the following claims.

EXAMPLE

Now having described the embodiments of the disclosure, in general, the examples describe some additional embodiments. While embodiments of the present disclosure are described in connection with the example and the corresponding text and figures, there is no intent to limit embodiments of the disclosure to these descriptions. On the contrary, the intent is to cover all alternatives, modifications, and equivalents included within the spirit and scope of embodiments of the present disclosure.

Field-effect transistors (FETs) that incorporate single-walled carbon nanotube (SWNT) networks experience decreased on-off current ratios ($I_{on}/I_{off}$) due to the presence of metallic nanotubes. The present example describes an embodiment of a method of the present disclosure to increase $I_{on}/I_{off}$ without the need for either specialized SWNT growth methods or post growth processing steps to remove metallic nanotubes. SWNTs that were grown using conventional arc discharge methods were deposited from aqueous suspension. Then, the SWNTs in the network were decorated with $Cu_2O$ nanoparticles that acted as controllable valves that restricted current flow at positive gate voltages. This resulted in an unprecedented reduction in $I_{off}$, as the sub-10 nm sized nanoclusters acted as numerous tunable valves, providing greatly improved network sensitivity to gate voltages in the relatively small range of ±10 V, increasing $I_{on}/I_{off}$ by up to 205-fold. Larger nanoclusters were found to increase the network conductivity, but decrease $I_{on}/I_{off}$. The ability to convert metallic SWNTs to semiconducting without removing them allows for enhanced $I_{on}$, and lower noise while still achieving greatly enhanced magnitudes of $I_{on}/I_{off}$.

INTRODUCTION

A drawback to the use of SWNT networks is their greatly reduced performance, relative to that observed for single-SWNT systems. This reduced performance is due to several factors that are addressed in this examples: (i) Inter-device precision is low in field-effect transistors (FETs) based on SWNT networks in part because changes in the Schottky barrier height between s-SWNTs in direct contact with the metal source and drain electrodes dictate much of the response to the gate voltage ($V_g$),[10-12] leaving the semiconductive channel largely unaffected. Also, the OFF-state current of SWNT network-based FETs is limited by the presence of the metallic pathways provided by m-SWNTs and small band gap s-SWNTs, since they are largely unaffected by $V_g$. These effects combine to increase the OFF-state source/drain leakage currents in SWNT-based devices, greatly reducing their energy efficiency. (ii) Due to the inter-SWNT tunnel junctions that must be traversed in a network, their electron mobility decreases up to three orders of magnitude, relative to that for individual nanotubes.[1,13] (iii) The poor attractive forces between metals and the π bonding network in nanotubes results in non-ohmic contacts, increasing contact R and thereby reducing the level of ON-state current efficiency that can be achieved at a given source/drain voltage, reducing the ON-state/OFF-state current ratio ($I_{on}/I_{off}$). An approach to overcoming these three challenges according to methods and devices of the present disclosure is described in detail below.

To address issues related to the variability in conduction for SWNTs (i), electrodeposition was used to form numerous $V_g$-tunable contacts composed of high work function nanoclusters along the SWNT sidewalls. This facilitated much greater coupling between the nanotube network and $V_g$, as occurs in conventional Si-based FETs, allowing several orders of magnitude in the reduction of $I_{off}$ that could be achieved. This was facilitated by decorating the network with nanoclusters of the high work function species $Cu_2O$ (Φ=4.9 eV).[14] This value is slightly higher than the experimentally determined work function of 4.6-4.8 eV for SWNT films.[15] High work function adsorbates withdraw electron density from s-SWNTs at the point of contact, increasing their band gap on a local level and increasing their sensitivity to gate voltages. $Cu_2O$ is readily formed via electrochemical methods and has been widely investigated for use in solar cells,[16,17] sensors,[18,19] and catalysis.[20,21] The π network in SWNTs is strongly affected by molecular adsorbates, with a molecular electron-withdrawing species increasing the nanotube's semiconductive character by increasing its band gap on a local level.

This example also presents evidence that a band gap can be opened in m-SWNTs, obviating the need to separate them from s-SWNTs before network formation. This will greatly simplify network formation and optimization. In fact, OFF-state source/drain leakage currents were greatly reduced, resulting in a 205-fold increase in $I_{on}/I_{off}$. As the effect of metallic pathways on $I_{off}$ is reduced, networks of increased density may be deposited without sacrificing $I_{on}/I_{off}$, facilitating the advantages in reproducibility and current drive provided by greater numbers of SWNTs.[22] This apparent conversion of m-SWNTs is attributed to the fact that they are not true metals, but in fact zero band gap semiconductors, or semimetals, like graphene.[23,24] Therefore, the deposition method for metal oxide nanoclusters of the present disclosure is an effective way to open a band gap in m-SWNTs by inserting a point where the conductivity can be controlled along an otherwise conductive nanotube (U.S. patent Appl.).[25]

The inter-SWNT tunnel junction (ii) is unique to network devices. At these junctions, surface-bound SWNTs have a slightly increased contact area to each other due to a slight deformation of the tubes caused by van der Waals attractions. However, since the tunneling probability for an electron decays exponentially with distance, the 3.5 Å van der Waals spacing between crossed nanotubes presents a non-trivial barrier. Additionally, Schottky barriers between m- and s-SWNTs present numerous high-R barriers in a network.[26-28]

In this example, inter-SWNT R was reduced by depositing low-defect, unbundled nanotubes in a manner that allowed control over the density and alignment of SWNTs in the network. Inter-SWNT R is greatly reduced for a network composed of individual nanotubes, compared to bundles.[29] Therefore, a new method was employed for producing suspensions of unbundled high aspect ratio SWNTs and depositing them without allowing bundle formation,[30] while maintaining strict density control over the network during all states of its formation.[31,32] Density control is important because as density increases, conductivity, current drive, $I_{on}/I_{off}$, and reproducibility increase. However, at very high nanotube density, the electron mobility and $I_{on}/I_{off}$ begin to decrease due to bundle formation and charge shielding.[33] Further, this deposition method allowed large number of SWNTs to be deposited either in a random orientation, or with partial alignment.[34] The ability to increase the SWNT alignment allowed the number of inter-SWNT tunnel junctions to be reduced, maximizing the advantages in electron mobility provided by the high aspect ratio SWNTs.

Recent computational studies by Li and Marzari found that while the inter-SWNT van der Waals distance is 3.5 Å, the C-transition metal atom distance is 2.4 Å.[35] This is a significant reduction in distance, considering the exponential dependence of tunneling current on the barrier distance. They also reported that the Cu—C bond was found to have a very low binding energy (0.38 eV), due to the full d-orbitals in Cu, and that transition metals with low binding energies with C had greater quantum conductance near the Fermi level between crossed s-SWNTs. Therefore, the electrodeposition of randomly distributed Cu-containing nanoparticles is expected to produce nanoparticles that fortuitously bridge inter-SWNT junctions and reduce inter-SWNT R by reducing the tunneling barrier distance between s-SWNTs, and the Schottky barrier height between m-SWNTs and s-SWNTs.

Optimizing electron transfer across heterojunctions, is an important consideration for incorporating any nanomaterial into conventional device structures. For SWNTs, this is complicated by difficulties with forming low-resistance metal-C bonds due to the poor "wetting" of $sp^2$-hybridized C by most transition metals, and Schottky barriers between s-SWNTs and metals.[36] This reduced attraction between metals and SWNTs leads to an increased electron tunnel barrier, increasing the R at source and drain contacts. An additional obstacle to interfacial transport is presented by the semiconductive variety of SWNTs, due to the formation of a Schottky barrier at their contacts to metal electrodes severely limiting the transistor ON-state current $I_{on}$.

Interfacial R was reduced as electrodeposited nanoclusters effectively nanosoldered the metal/SWNT junctions, providing an increased contact area to all SWNTs, and a reduced Schottky barrier height to s-SWNTs. The reduced C-transition metal atom distance expected for the Cu oxides allowed them to act as low resistance "shunts" that facilitated electron transfer to/from metal source and drain electrode pairs. This addresses a critical concern, as interfacial contacts often dictate the electrical properties of SWNT-based systems, rather than the enhanced properties of nanotubes.[37]

Previous efforts to reduce the interfacial R between SWNTs and metals often involved high temperature annealing. For example, chemical reactions between SWNTs and various metal carbides were driven at temperatures above 900° C. to form nanotube-carbides, reducing R to $\sim\frac{1}{4}^{th}$ of its original value.[38] In another instance, resistive heating of a gold electrode was used to effect "local melting," in order to embed multi-walled carbon nanotubes (MWNTs) into the electrodes.[39] The R was reduced by 60%, with the effect being attributed to increased interfacial contact area to the MWNT. A 5-fold increase in current was also achieved by using the electron beam in a scanning electron microscope to solder MWNTs to Au electrodes by decomposing a gas phase gold-C precursor.[40]

As described in a related application, controlled chemical oxidation, followed by annealing at just 300° C. could greatly improve the conductivity in SWNT networks.[41] The order in which the various device structures were formed played a crucial role in the extent to which R could be reduced during post-fabrication treatments. When electrical contacts were deposited on top of pre-existing networks, a moderate level of R reduction was observed. This indicates that when the metal/SWNT contacts were closed to further chemical reactions, the only reduction in R observed was that due to the enhanced inter-SWNT contacts formed during annealing. This was confirmed by Raman microscopy, which indicated a reduction in the density of sidewall defects in SWNTs, and the desorption of residual dopants. However, when the network was deposited on top of pre-fabricated Ti electrodes, a 13-fold reduction in R and an 18-fold increase in the inter-device precision could be ascribed to the formation of "molecular anchors" at the inter-SWNT and metal/SWNT junctions. Evidently, the large contact area over which there was chemical access to the metal/SWNT interface, relative to device structures with nanotubes buried in metal electrodes, allowed for greater optimization of the interface. The chemical access provided by depositing SWNTs onto prefabricated Ti electrodes also provides a unique opportunity to use electrodeposition to increase electronic transport properties.

In order to test an electrochemical approach to device optimization, Ti electrodes were formed on a variety of silica-terminated surfaces. SWNTs do not readily adhere to native silica or Ti surfaces. However, the native oxide that formed on Ti in air resulted in a titania-terminated surface, which like silica was amenable to modification via self-assembled monolayer formation by a silane. Therefore, all surfaces were treated with a silanization agent to form a self-assembled monolayer that served as an adhesion layer. Then, electrodeposition was used to form conductive shunts through the silane and the native $TiO_x$ adlayers, bridging the electron tunneling gap between SWNTs and the conductive Ti below. To simplify the discussion of these titania surfaces, they will be referred to as $Ti/TiO_x$. Although $Ti/TiO_x$ was used for these studies, this method is expected to significantly improve interfacial electron transport between SWNTs and other metals that form native oxides, like Al, Ta, Ni and various ferrous systems. Additionally, interfacial contacts to metals that do not form native oxides would also be improved via the increased contact area provided by the conductive nanoparticles that coat the SWNTs. $Cu^{2+}$ was used for electrodeposition in these studies since its oxides form readily in an electrochemical environment and they are p-type, wide band gap semiconductors, like SWNTs. Also, the copper oxides have high work functions, which allow them to serve as electron withdrawing dopants when in close contact with nanotubes.

The electrochemical nanosoldering method described in this example is a room temperature, inexpensive, and facile route to obtaining great gains in conductance and $I_{on}/I_{off}$ since it specifically decorates the SWNTs and metal electrodes with nanoclusters of controllable size distributions. This is facilitated by control over the magnitude of the driving force for the metal deposition (via the electrochemical potential), and precise control over the average size of the nanoparticles (via the charge that is allowed to pass). Further, electrodeposition is a non-line-of-sight deposition method that prohibits deposition on nonconductive parts of the surface, allowing preferential deposition at defect sites on individual SWNTs dispersed on insulating substrates. These abilities provide distinct advantages over physical vapor deposition methods, which indiscriminately deposit molten metal nanoparticles over the entire sample.

Experimental Details

Substrate Preparation

A dual-filament thermal evaporator (Thermionics), operating under high vacuum ($P<1\times10^{-6}$ torr), was used to deposit 150 nm of Ti (99.995% pure ⅛" diameter pellets, Kurt J. Lesker Company) onto either glass slides or photoresist-coated, lithographically patterned $Si/SiO_x$ wafers. Then, the substrates were cleaned with a compressed $CO_2$ snow-jet. The entire samples, including the $Ti/TiO_x$ electrodes, were modified with a silane monolayer that served as an adhesion layer for the SWNTs, using a method described previously by this group.[30,31] Briefly, samples were immersed for 45 min. in a solution of 10 mM 3-(aminopropyl)triethoxysilane (3-APTES, 99%, Aldrich) in ethanol (99.5%, absolute 200 proof, ACROS). Next, the samples were cleaned in a stream of fresh ethanol and then water. In order to ensure that excess layers of the silane were removed, the surfaces were cleaned with compressed $CO_2$ from a snow-jet, as this has proven effective for removing excess silane, leaving only a strongly bound monolayer on the surface.[42]

For testing the effect of nanocluster formation on SWNT network FETs, source and drain electrode pairs were formed using standard optical lithography methods. This involved UV light exposure through a patterned quartz mask to project the pattern for the electrodes onto photoresist-coated $Si/SiO_x$ wafers. This was followed by Ti physical vapor deposition and photoresist lift-off to yield 150 nm-thick source/drain electrode pairs on top of a 500 nm thick thermally grown dielectric $SiO_x$ layer. Prior to SWNT network deposition, these samples were modified with a silane layer, as described above.

SWNT Suspension and Network Formation

Arc discharge soot (AP grade, Carbon Solutions, Inc.) was dispersed into an aqueous 1% sodium dodecyl sulfate (SDS, J. T. Baker) solution via probe ultrasonication (Fisher Model 500) at a power density of 0.4 W/mL. These conditions have been previously demonstrated to be effective at forming stable suspensions of high aspect ratio SWNTs, while minimizing sonication induced damage to the nanotube sidewalls.[43] Next, a low relative centrifugal force (RCF) processing method was used to separate the undamaged, high aspect ratio SWNTs from amorphous C and residual catalyst contaminates.[30]

This example uses a SWNT network formation method that uses iterative deposition cycles to grow a network from the bottom up, while avoiding SWNT bundle formation.[34] To deposit reproducible densities of unbundled SWNTs bridging the electrodes, the silanized surfaces were wet with a purified SWNT suspension, then immediately dried in a unidirectional stream of $N_2$ and rinsed with copious amounts of $H_2O$. This deposition cycle was repeated eight times for all samples to build networks that were composed of similar densities of unbundled SWNTs, as described previously.[31,32,34] For samples designated "aligned," one drying direction was used to deposit SWNTs, while for "crossbar" samples an equal number of orthogonal deposition steps were used. The initial R, prior to electrochemical experiments, was ~1 MΩ for all samples.

Electrochemical Setup

In order to determine the effect of the area of the SWNT network relative to the contact area provided by the metal electrodes ($A_{network}/A_{Ti}$) on the electrochemical response and change in two-terminal R, samples of various dimensions were analyzed in either sealed glass beakers, or homemade glass electrochemical cells, as described below. The glass cells employed a Viton gasket at the bottom that restricted the working electrode's area to a 1.0 cm diameter disk. All cells were purged with high-purity $N_2$ for at least 30 minutes prior to all experiments. Solutions were composed of 0.1 M $CuSO_4$ and 0.1 M $H_2SO_4$ (Aldrich) in ultrapure water (18.2 MΩ, Millipore). Standard three-electrode electrochemical cells, with each sample serving as the working electrode, were connected to a potentiostat (CH Instruments, 600C), with a Au wire serving as a counter electrode, and a Ag/AgCl reference electrode (3 M KCl, BASi). A scan rate of 50 mV/s was used for all cyclic voltammetry (CV).

Analytical Methods

Atomic force microscopy (AFM) was performed in air using intermittent contact mode (Molecular Imaging, PicoPlus). To determine the effect of various electrodeposition conditions on the density and height of the nanoclusters, at least five areas of each sample were analyzed with AFM image analysis software (WSxM, v5.0).[44] Raman spectroscopy (Thermo Scientific, DXR SmartRaman) was performed on samples using a 532 nm laser excitation source with 5 mW intensity at the sample, 100× objective, and a charge-coupled (CCD) detector. A semiconductor characterization system (Keithley, 4200SCS) and a probe station (Signatone, S-1160A) were used to ascertain the effect of nanoparticle size on two-terminal R and transistor performance.

Results and Discussion

Electrochemistry of $Cu^{2+}$ on Modified $Ti/TiO_x$ Surfaces

The ~20 Å thick native oxide that spontaneously forms on fresh Ti surfaces exposed to air is largely composed of $TiO_2$, which is essentially an insulator since it has a band gap of 3.7 eV.[45] Crystalline forms of this passivation layer are of interest as a dielectric material in electronic device structures.[46] In this example, thermal evaporation was used to form amorphous Ti layers with native oxides that were highly inhomogeneous, characterized by numerous grain boundaries and defects. Previously reported conductive atomic force microscopy (C-AFM) studies of polycrystalline $Ti/TiO_x$ electrodes showed that $TiO_2$ layers over grain boundaries between crystals in the underlying Ti had a more than 200-fold increase in conductivity compared to layers over crystal facets.[47,48] They were only able to estimate the size of conductive hotspots at <50 nm, due to the resolution limits imposed by the C-AFM probe.

The electrochemical response of Ta electrodes (terminated by a 25 Å thick native oxide) was found to be defined by microscopic electrochemically active low-valence-oxide defects in a largely dielectric layer.[47] In the case of the Ti surfaces described herein, low valence Ti oxides ($Ti_2O_3$ and nonstoichiometric TiO) existed as shunts through the dielectric $TiO_2$ adlayer. Metallic conduction is observed for the nonstoichiometric Ti oxides which have a Ti/O ratio of 0.8 to 1.7.[49] The amorphous $Ti/TiO_x$ surfaces used in these studies are expected to have numerous sub-nm sized electrochemically active hotspots that represent conductive shunts to the underlying Ti. These shunts, when electrically connected to SWNTs, provide a valuable route to reducing the interfacial R in device structures.

The $TiO_2$ oxide caused the $Ti/TiO_x$ samples to have a smaller electrochemically active surface area, as the conductive defects acted as an array of connected nanoelectrodes. This resulted in the nucleation and growth of numerous nanoparticles, rather than the formation of the conformal monolayers observed on noble metal surfaces. $Ti/TiO_x$ surfaces were investigated at every step of the surface preparation process as follows (FIG. 1A): the unmodified $Ti/TiO_x$ surface, the silane-modified surface ($TiO_x$/silane), and the silane-modified surface with adsorbed SWNTs ($TiO_x$/silane/SWNTs).

Figure 1B:
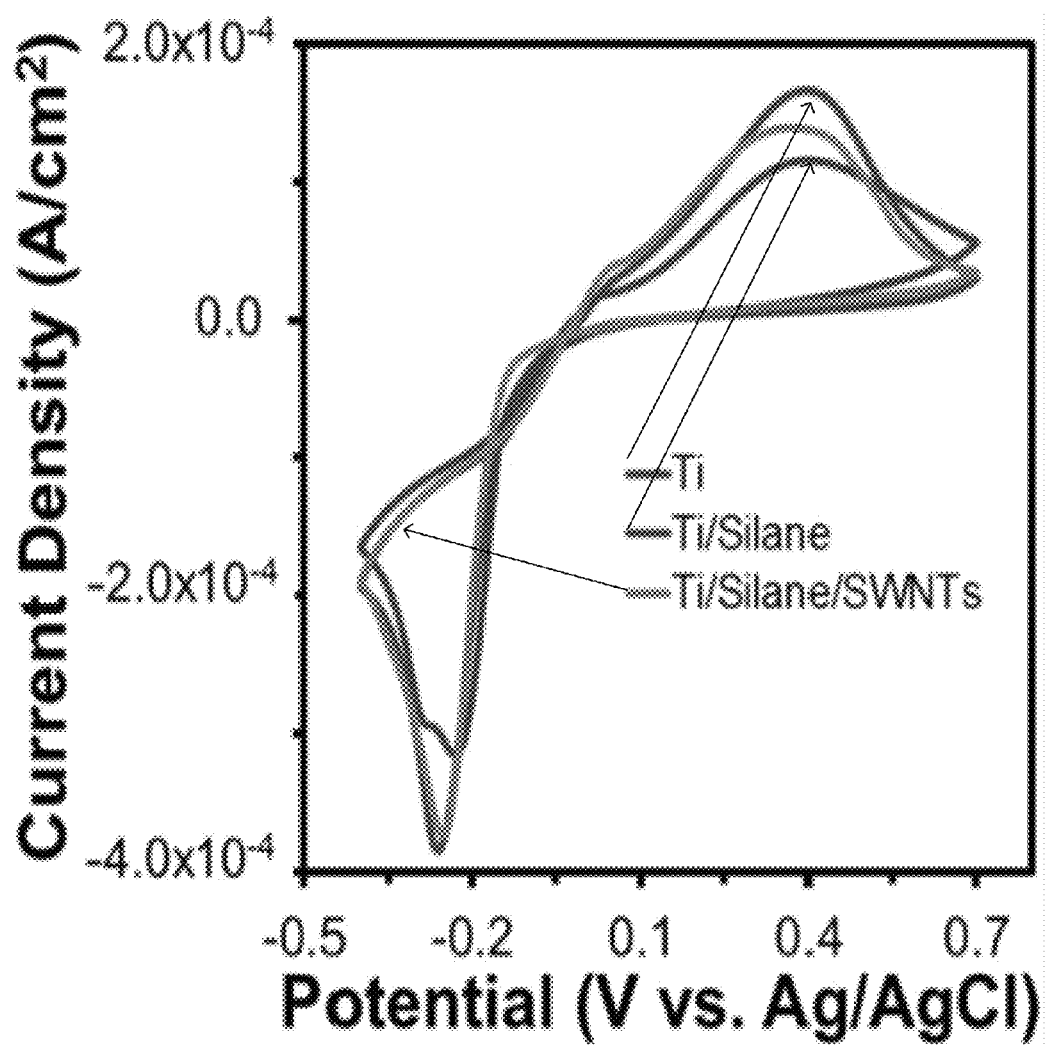

Numerous $Ti/TiO_x$ samples were prepared as described above and mounted in a cell that restricted the electrochemically active area to 1 $cm^2$. Freshly made samples were used for each electrochemical experiment and AFM analysis of deposits demonstrated that the density of nucleation points was similar for all samples of $Ti/TiO_x$. As each CV started at the equilibrium potential, 0.35 V, and progressed at 50 mV/s in the negative (cathodic) direction, a large peak between −0.20 and −0.30 V corresponded to the reductive deposition of copper oxide nanoclusters (FIG. 1B). The $TiO_x$/silane/SWNTs samples had increased electrochemical current for these cathodic waves, relative to the $TiO_x$/silane samples. It appears that the presence of the highly conductive SWNTs provided an increased density of nucleation points, resulting in the deposition of greater densities of nanoparticles, and commensurately higher current. Each cathodic scan ended at −0.4 V, where the scan direction was reversed, and an anodic scan (toward positive potentials) began. Initially, the magnitude of reductive current remained high enough to cause each anodic curve to cross the cathodic scan at two points, near −0.16 and −0.02 V. While this behavior would be unusual for the electrodeposition of a conformal layer on a flat, noble metal surface, it is commonly observed for electrodeposition on metal oxide-terminated surfaces. Such crossover points are caused by nucleation and growth processes enhancing the electrode area, and thus the deposition current.[50,51]

As the anodic scan continued, the large wave around 0.4 V represented the oxidation of surface-bound species to form $CuO_{(s)}$ and $Cu^{2+}_{(aq)}$. For the $Ti/TiO_x$ samples, the amount of charge flow was 9,539 and 1,300 mC in the cathodic, and anodic waves, respectively. The larger magnitude of the cathodic current indicated that the complete oxidative dissolution of CuO did not occur. Potentials positive enough to facilitate complete oxidation of CuO would have further oxidized the $Ti/TiO_x$ surface,[50,52] increasing the thickness of its native oxide and the interfacial R between the SWNTs and electrode. The amount of current for the deposition of nanoparticles decreased notably for the $TiO_x$/silane samples, relative to the $Ti/TiO_x$ samples. This was due in part to the silane effectively reducing the active electrode area by inhibiting access to the conductive shunts in the $Ti/TiO_x$ surface.

Figure 1C:
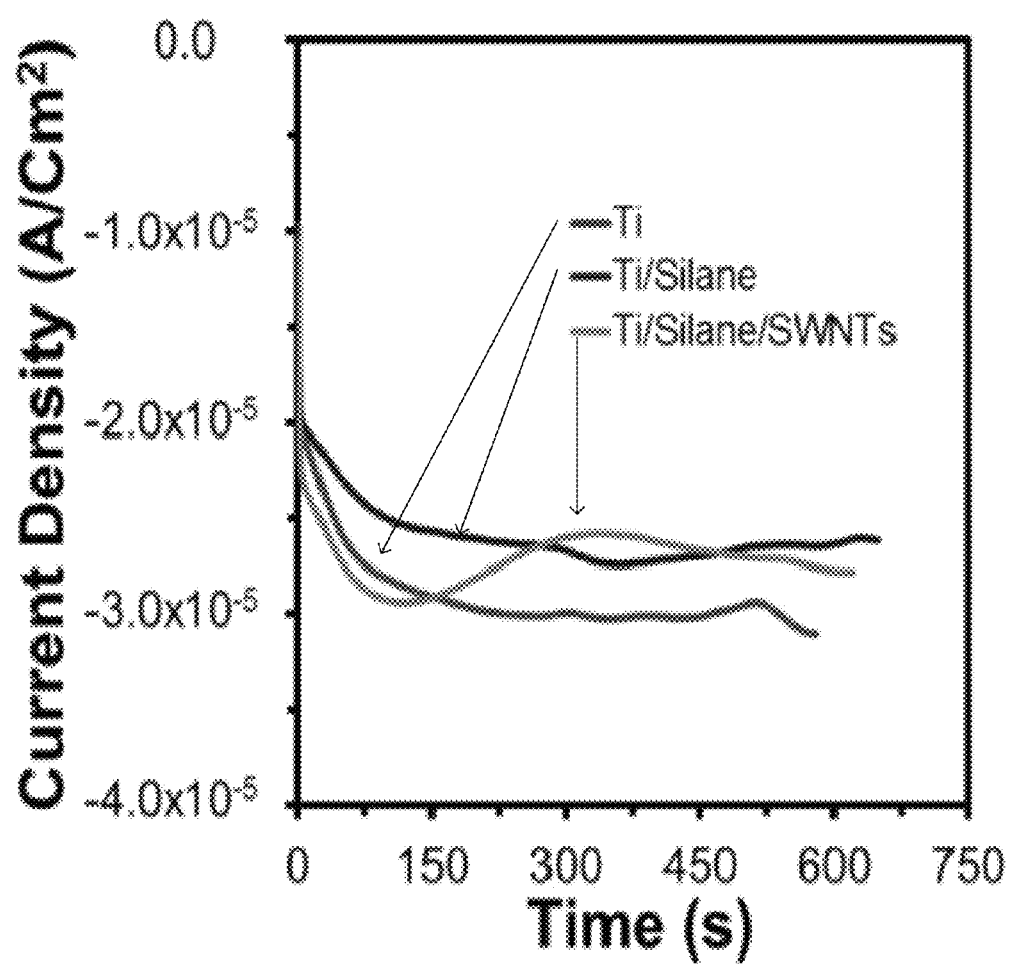

After CV revealed the potentials at which nanoparticle deposition occurred, constant potential deposition (chronoamperometry) at 0.10 V vs. Ag/AgCl was used to obtain information regarding the reaction rate on each surface. The amount of charge allowed to flow was limited to 16.7 mC for each surface, as this allowed the growth of nanoparticles of sufficient size to be characterized with AFM, as discussed subsequently. As 0.10 V is just negative of the equilibrium potential (0.35 V), the reaction rate was slow and the shape of the extended i vs. t curves could be examined to determine the effect of each surface treatment on the transient current response observed (FIG. 1C). The $Ti/TiO_x$ samples had the highest current density, followed by the $TiO_x$/silane samples due to inhibition of electron transfer caused by the silane monolayer, as was the case for CVs. However, the $TiO_x$/silane/SWNT samples differed markedly with respect to the other samples, as the i vs. t curves had a sigmoidal shape that indicated the initial nucleation process was enhanced. Then, the current reached a brief diffusion-limited regime that was followed by a broad wave of increasing current density. Additional experiments revealed that this increase in current continued indefinitely for the $TiO_x$/silane/SWNT samples.

Metals that are not terminated by oxide layers (i.e. Au, or Pt) typically have i vs. t traces with an initial spike in current, followed by an extended region of steady-state current. This initial current spike is due to the charging of the electric double-layer and the immediate reaction of electroactive species at the electrode's surface, while in the steady-state region, deposition is limited by the rate of diffusion of the analyte to the electrode. Alternatively, unique chronoamperometric current transients are often observed during electrodeposition at heterogeneous metal oxide surfaces,[53] where an initial spike in current indicates instantaneous nucleation. This is followed by a broad sigmoidal feature that is typical of progressive nucleation (the density of nucleation sites increases with time), in addition to growth, resulting in continually increasing current density. This sigmoidal feature is typically observed at high driving forces (more negative potentials) for the reaction, so its observation for the $TiO_x$/silane/SWNT samples indicated that the SWNT enhanced the nucleation process. Then, at longer deposition times, continually increasing current is expected due to the continuously increasing electrode area.

Figure 1D:
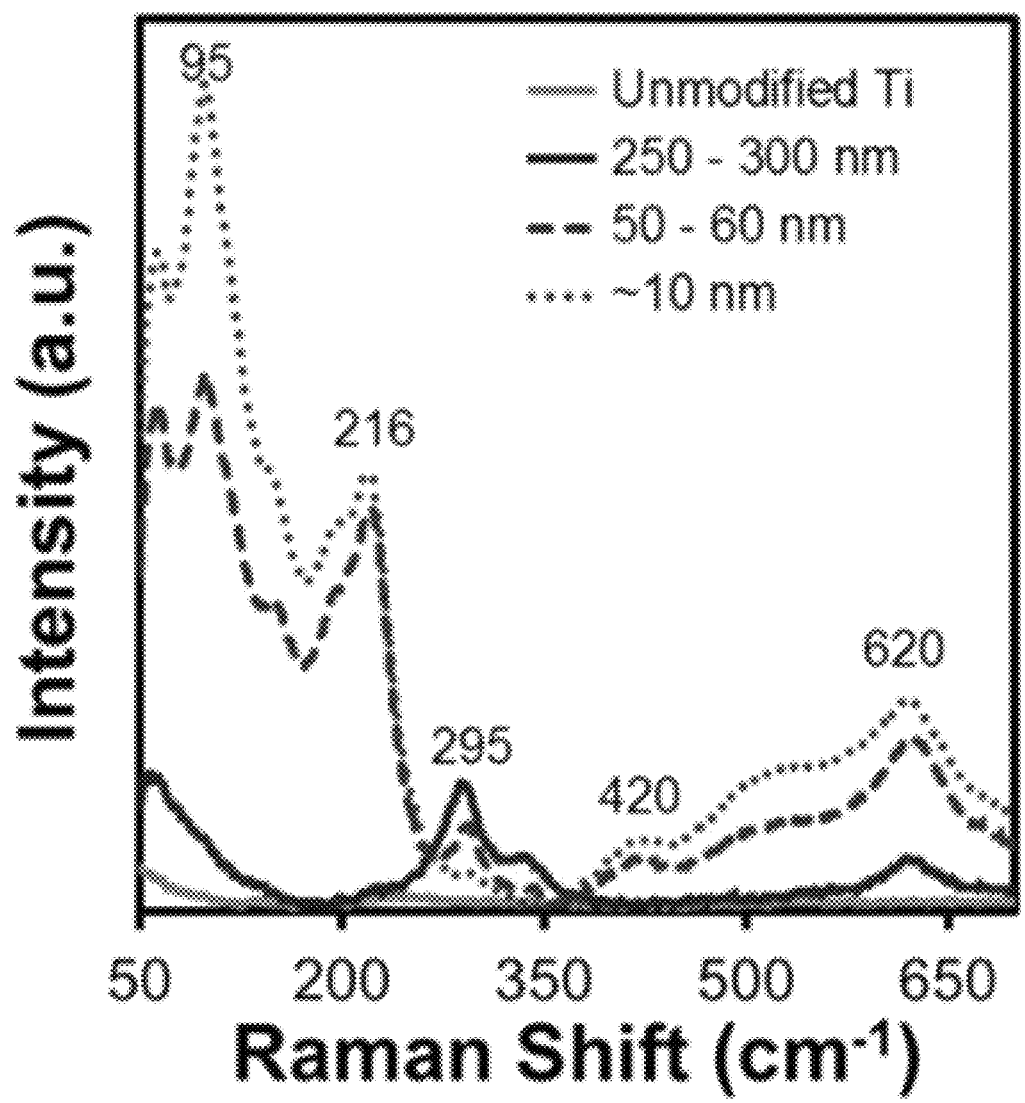
Figure 2:
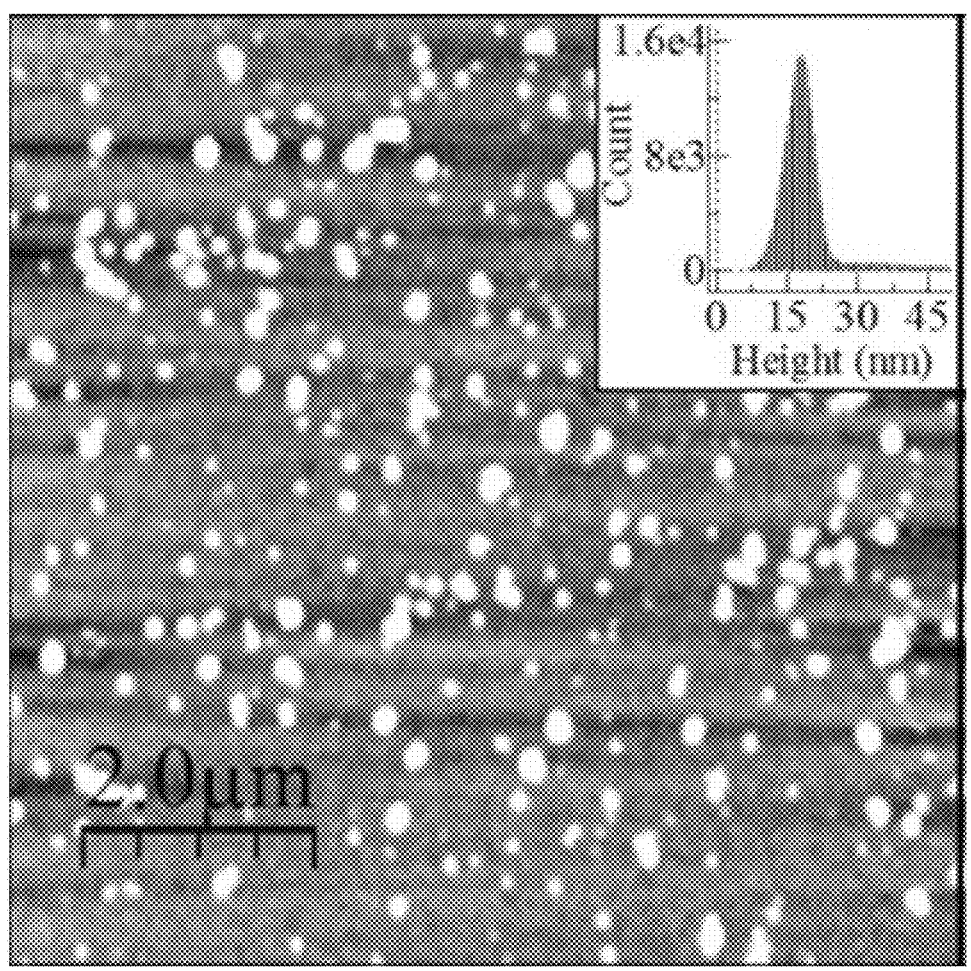
FIG. 2 illustrates an image of a representative AFM micrograph (8×8 μm) showing nanoparticle growth on the Ti/TiO$_x$ surface after deposition at about 0.10 V for a charge of about 16.7 mC. Each nanoparticle reveals the location of a conductive pinhole (low valence Ti oxide, or conductive grain boundary) through the dielectric TiO$_2$ surface.

Electrodeposited Cu microstructures are known to exist as composites of Cu, $Cu_2O$, and CuO, with $Cu_2O$ being the dominate species.[54,55] In this example, Raman microscopy indicated that the nanoparticles existed as $Cu_2O$, CuO, or Cu nanoparticles for small, intermediate, and large charge densities, respectively (FIG. 1D). For electrodeposition on $Ti/TiO_x$ substrates, size gradients were observed for the nanoparticles, with the size decreasing with increasing distance from the point of contact for the working electrode. This can be attributed to the electrical resistance in the $Ti/TiO_x$ samples caused by numerous grain boundaries in these amorphous samples, and the various inclusions and defects at the surface. For the smaller nanoparticles, confocal Raman spectra had peaks expected for scattering at phonons in $Cu_2O$, at 95, 216, and 420 $cm^{-1}$.[18,56] As the size of the nanoclusters increased, these peaks decreased in intensity and a wave at 295 $cm^{-1}$, indicative of CuO,[57] increased in prominence. $Cu_2O$ and CuO have overlapping Raman active phonons at 620 $cm^{-1}$. While an observable spectrum was not obtainable for the sub-10 nm clusters that were deposited in these studies, they are presumed to be largely composed of Cu$_2$O. The inhomogeneous nature of the native oxide layer in these samples resulted in conductive TiO and Ti$_2$O$_3$ shunts through the nonconductive TiO$_2$ adlayer. TiO, in particular, exhibits metallic conduction,[58] but defects at grain boundaries in these samples also provided conductive shunts to the underlying Ti. The examination of numerous Ti/TiO$_x$ deposits with AFM allowed visualization of the density of conductive shunts, as evidenced by the presence of nanoparticles (FIG. 2). A histogram of the height information obtained in every pixel of the image, or z-range, revealed that the average height increased from 6.83 nm (image not shown), to 20.69 nm, with a maximum height of 115.27 nm.

Figure 3:
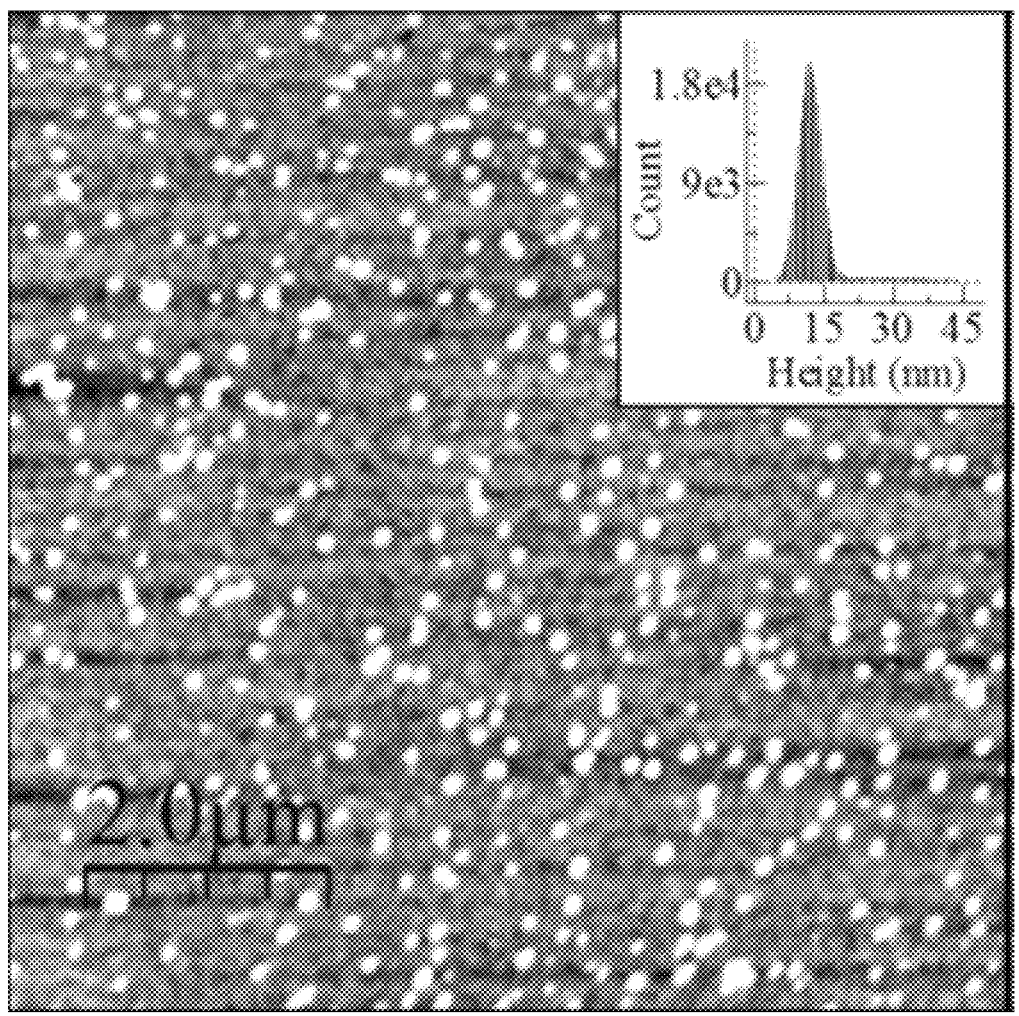
FIG. 3 illustrates a representative AFM image (8×8 μm) of the TiO$_x$/silane samples showing how the addition of a silane monolayer resulted in smaller and more closely clustered nanoparticles than those observed on the Ti/TiO$_x$ surface.

For the TiO$_x$/silane samples, a larger density, but smaller size of nanoparticles was observed under identical deposition conditions. Also, their spatial distribution decreased, with closely spaced clusters appearing throughout each AFM image (FIG. 3). The average height in this representative image decreased to 13.97 nm, with a maximum of 84.51 nm. These observations can be explained by the silane monolayer acting as a defect-prone dielectric layer on the conductive shunts in the electrode, increasing the electrode/electrolyte separation by ~7 Å,[59] the monolayer thickness for 3-APTES. Due to the surface roughness of the Ti/TiO$_x$ samples, the silane was expected to have few crosslinkages between monomers and to be characterized by a high defect density. This resulted in a larger number of smaller diameter conductive pinholes through the silane, which were revealed by the location of the nanoparticles. This resulted in closely spaced clusters of smaller Cu$_2$O nanoparticles, relative to those observed on the Ti/TiO$_x$ surface.

Figure 4A:
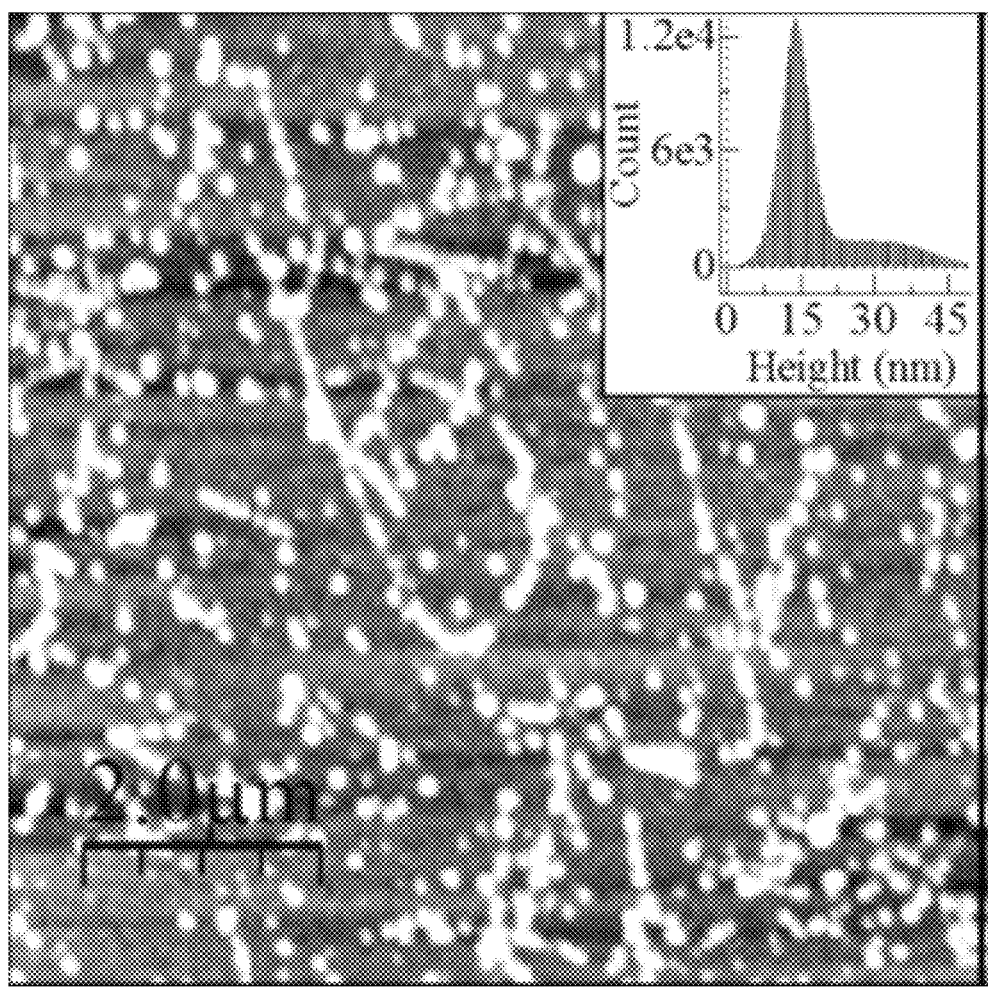
FIGS. 4A-4B illustrate representative AFM images of a TiO$_x$/silane/SWNT sample.
Figure 4B:
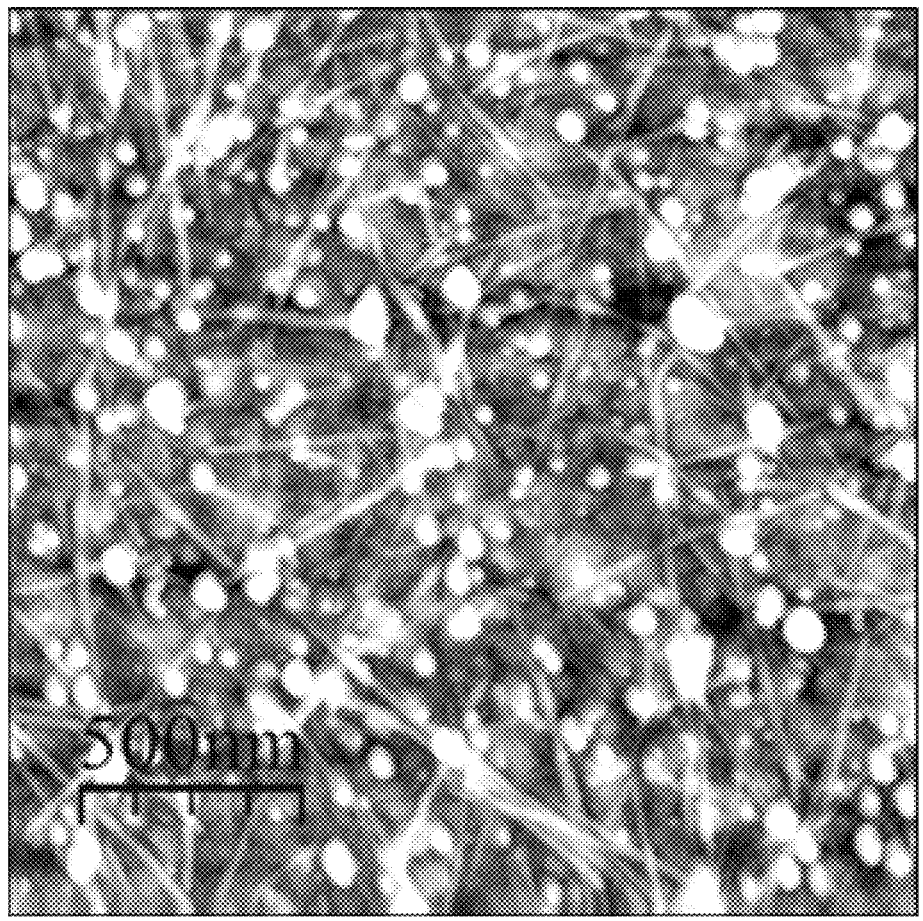

While the presence of a silane monolayer inhibited electrodeposition on Ti/TiO$_x$, the TiO$_x$/silane/SWNT samples had much larger nanoparticles, with many observed to preferentially deposit along the sidewalls of the nanotubes (FIG. 4A). Nanoparticles that connect multiple SWNTs also likely provide low-R tunnel barriers that improve inter-SWNT conduction (FIG. 4B). The average height observed in a representative image increased from 13.97 nm for the TiO$_x$/silane samples, to 18.85 nm, with a maximum of 111.11 nm. AFM image analysis software was used to estimate the volume occupied by the nanoclusters by summing the quotient of the x, y, and z distances measured for each point higher than 1 nm on the surface. As the same charge and electrochemical conditions were used to form these three types of deposits, they were expected to have similar amounts of material deposited, despite their clear differences in morphology. Analyzing the volume occupied by these nanoclusters provided insight into the effect of the surface properties on the charge efficiency for deposition on each surface. The volume occupied by deposits for the three surfaces were 1.3, 0.83, and 1.1 μm$^3$, for the Ti/TiO$_x$, TiO$_x$/silane, and TiO$_x$/silane/SWNT surfaces, respectively. The decreased amount of nanoclusters on the TiO$_x$/silane samples may be attributed in part to the strong silane/TiO$_x$ bond disrupting the local oxidation state of the Ti/TiO$_x$ surface, thus increasing the density of conductive shunts. Also, the silane monolayer increased the distance between the electrolyte/electrode interface. This would effectively decrease the interfacial capacitance and result in the need for greater charging current to achieve the applied electrochemical potential, decreasing the current efficiency for nanoparticle formation. This effect is expected to be lessened for the TiO$_x$/silane/SWNT samples since the nanotubes provided a high capacitance electrode through which more efficient electrodeposition could occur. The formation of these conductive nanoclusters presents an important opportunity to reduce the interfacial R caused by the weak attraction between sp$^2$ hybridized C and metal electrodes. This possibility will be explored below.

Electrochemistry of SWNT Networks

Figure 5A:
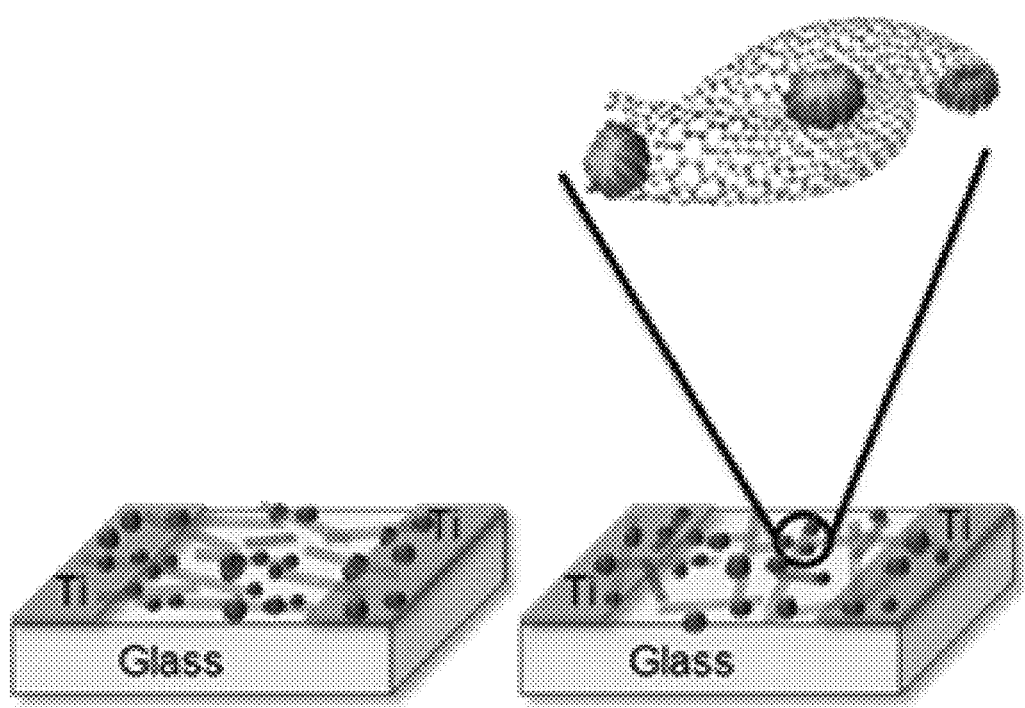
FIGS. 5A-5B illustrate the effect of Cu nanoparticle deposition on the two terminal R of aligned (left), and crossbar (right) networks (FIG. 5A, schematic, not drawn to scale), and Cottrell plots (i vs. $t^{-1/2}$) of the transient current response recorded during nanoparticle growth (FIG. 5B), showing that when the charge allowed to pass was limited to about 16.7 mC, the higher current densities for the crossbar networks caused them to achieve that value at significantly shorter times.
Figure 5B:
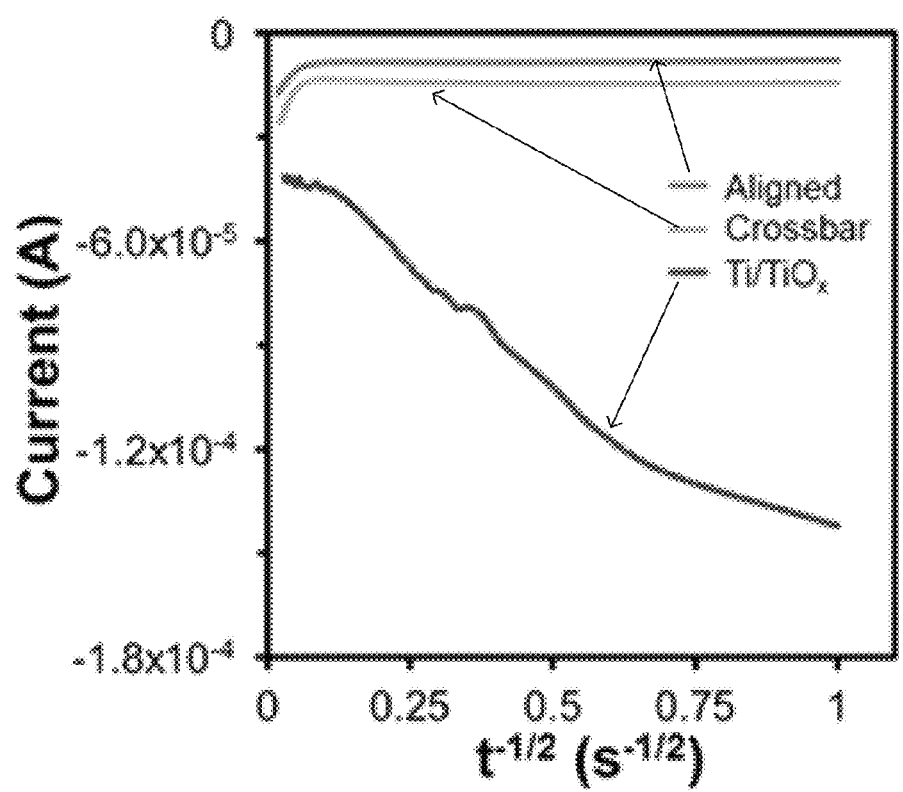

In order to investigate the effect of the electrodeposition of nanoparticles on the two-terminal R of networks, an SWNT network was deposited across two Ti/TiO$_x$ electrodes that were bridged by an insulating glass substrate (FIG. 5A). This configuration approximates that of the source and drain electrodes found in field-effect transistors. The devices were constructed so that two Ti/TiO$_x$ electrodes with a combined area of 1.5 cm$^2$ were separated by a 1.0 cm insulating gap with an area of 2.5 cm$^2$. After each sample was silanized, a network composed of similar densities of either partially aligned or crossbar oriented SWNTs was deposited. Finally, electrodeposition at 0.10 V was performed until a total charge of 16.7 mC passed (FIG. 5B). The aligned network reached this charge at 2,908 s, while the crossbar network required only 2,026 s. Chronoamperometry curves for the two types of networks differed, with the crossbar networks having higher current densities.

At the instant a macroscopic planar electrode is polarized at a potential where an electroactive species is reduced, there is a spike in current due to the flow of an initial charging current and the commensurate reaction of the electroactive species in the immediate vicinity of the electrode. While the charging current decays exponentially with time, the diffusion-limited current from the analyte decays more slowly until a steady-state level is reached. This decay is described by the Cottrell equation,[60]

$$i = \frac{nFAC\sqrt{D}}{\sqrt{\pi t}} \quad (1)$$

where i is current, n is the number of electrons transferred per electroactive ion or molecule, F is the Faraday constant, A is the area of the electrode, C is the bulk concentration of the electroactive species, D is its diffusion coefficient, and t is the time in seconds. This equation describes how the diffusion-limited current observed at a macroscopic electrode decays as a function of the inverse square root of time, as the other factors are constants. Then, a plot of i vs. t$^{-1/2}$ is expected to lead to a linear regression with a current that approaches zero at very long times. The slope of this line is proportional to the square root of the diffusion coefficient for the electroactive species.

Even though the Ti/TiO$_x$ electrodes are electrochemically active only at the conductive shunts through the TiO$_2$ adlayer, at long times (i.e. t$^{-1/2}$<0.6) they behaved as planar macroscopic electrodes of an area that included the shunts and the insulating part of the surface as the diffusion layers for each conductive shunt (each having enhanced, hemispherical diffusion) grew and overlapped to form one large zone from which the Cu$^{2+}$ could diffuse.[61] The slight nonlinearity near t$^{-1/2}$=0 is due to convective currents. At short times, the current density was limited to the sum of the small diffusion fields that surrounded each conductive shunt, reducing the effective area of the electrode to that expected for an electrically connected array of nanoscaled electrodes separated by inert surroundings. Also, at short times, capacitive charging currents (non-Faradaic) contributed significantly to the current response, as the volume of electrolyte that contributed to them was much larger than the diffusion layer. However, the capacitive current decayed exponentially with time, while the diffusion layer for each nanoelectrode slowly grew, resulting in linear diffusion. As linear diffusion began to dominate, there was an increase in the slope of the line for the Ti/TiO$_x$ sample at ~$t^{-1/2}$=0.6. To put it simply, at short times the current essentially represented the combined area of the each isolated shunt, and non-Faradaic processes, while at longer times, the current was more representative of the diffusion-limited reduction of $Cu^{2+}$ at a homogeneous macroscopic planar electrode.

An examination of the linear regressions for the SWNT networks provided a clear indication of the difference in their electrochemical performance, relative to the Ti/TiO$_x$ system. The Cottrell equation presumes that planar diffusion is the only significant contributor to mass transport. However, as these SWNT arrays were interconnected cylindrical nanoelectrodes where hemispherical diffusion of $Cu^{2+}$ to electrochemically active defect sites dictated the current response, hemispherical diffusion dominated over the entire time scale of the experiments. This was due to the small driving forces used, relative to the equilibrium potential for the reduction of $Cu^{2+}$, the low defect density SWNTs providing widely spaced nucleation points, low density of SWNTs, and the limited size (sub-10 nm Cu$_2$O) of the nanoparticles that were grown. Consequently, at the time scales used in these experiments, hemispherical diffusion dominated, unlike the planar diffusion observed for the Ti/TiO$_x$ electrodes at long times. Since hemispherical diffusion is characterized by continued growth of the diffusion layer, this allowed each defect site to draw from an ever-expanding zone of the bulk solution. For growth periods much longer than those used in these studies, as the nanoparticles continues to grow, their diffusion layers would eventually overlap, and linear diffusion would then dominate. For the experiments displayed in FIG. 5B, before diffusion layer overlap occurred, convective currents in the solutions led to increased current for 0<$t^{-1/2}$<0.1 $s^{-1/2}$. While the Ti/TiO$_x$ samples were similarly affected by convective currents, the effect was more pronounced for the SWNT network electrodes because of their ever-expanding diffusion zones. The current response of a cylindrical nanoelectrode can be described by the equation $$i = \frac{nFAC\sqrt{D}}{\sqrt{\pi t}} + \frac{2nFACD}{r\ln(4Dt/r^2)} \quad (2)$$

where r is the radius of the electrode. The first term was important at very short times, when planar diffusion dominated. While the second term describes the steady-state current observed at long times when hemispherical diffusion dominated. When r is in the nm-regime, the time it takes for the second term to dominate, and thus the time to reach a steady-state current, is very short. Additionally, as the magnitude of capacitive currents scales with electrode area, the charging current is very small for this system.

Electrochemical Growth of Nanoclusters on SWNT Networks

The reduction of defect density in suspension processed SWNTs is an important consideration for their ultimate use in electronic and structural materials. Recently, Fan and coworkers found that 3.5 M HCl treatments increased the sidewall defect density at a rate of ~1/μm/hr for chemical vapor deposition-grown nanotubes, and that suspension processed arc discharge SWNTs had a defect density exceeding 1 per 100 nm, due to the harsh ultrasonication and acid treatments used to suspend and purify the nanotubes.[62] In order to minimize defect density, the arc discharge soot used in these studies was processed using low power ultrasonic agitation for dispersion, followed by iterative centrifugation at low G to separate high aspect ratio SWNTs.[30] This resulted in stable suspensions of high aspect ratio SWNTs having low defect densities, while acid purification methods would have imparted defects that would increase electron scattering along the length of each SWNT, thus increasing R. Additionally, because defect sites are the preferred locations for nanoparticle nucleation on SWNTs, reducing the sidewall defect density increased the spacing between Cu$_2$O nanoparticles to a level that allowed each to act as a discrete, tunable valve. Therefore, control over the density of SWNTs in the network and their defect density obviates the need to control the location of defect sites since varying the ultrasonication or chemical conditions used during suspension formation presents a powerful opportunity to control the overall density of nanoparticles for other electronic applications.

In order to investigate the effect of electrodeposited metal oxide nanoclusters on the $I_{on}/I_{off}$ of SWNT network-based FETs, standard lithographic methods were used to form Ti/TiO$_x$ electrodes on Si/SiO$_x$ wafer fragments so that the conductive underlying Si could be used as a gate electrode during device testing. Then, Ti/TiOx electrodes served as source and drain electrodes that were bridged by SWNT networks. These FETs had a channel length and width of 300 and 100 μm, respectively. While methods for aligning and coating SWNTs with metals have microelectronic and sensing applications, the focus of these investigations was the effect of Cu$_2$O nanoparticles on the semiconductive character of a network composed of a mixture of s- and m-SWNTs. Therefore, a deposition voltage of 0.10 V vs Ag/AgCl and charge flow limits were used to limit the size of the nanoparticles to less than 15 nm. The use of potentials increasingly negative of the equilibrium potential were found to increase the size of the nanoparticles until they coalesced and completely coated the individual SWNTs comprising the network.

Figure 6A:
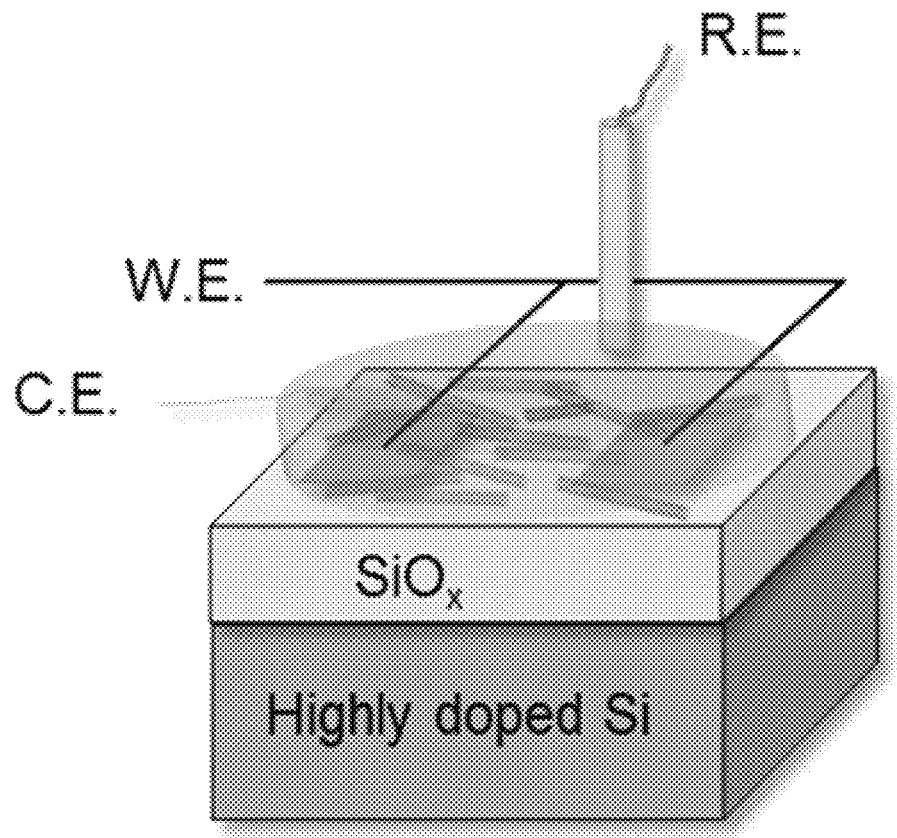
FIG. 6A is a schematic illustration of a source/drain electrode pair, and the SWNT network between, serving as the working electrode during the electrodeposition of various amounts of Cu$_2$O nanoparticles at about 0.10 V vs. Ag/AgCl. The charge was used to tune the amount of metallization that occurred.
Figure 6B:
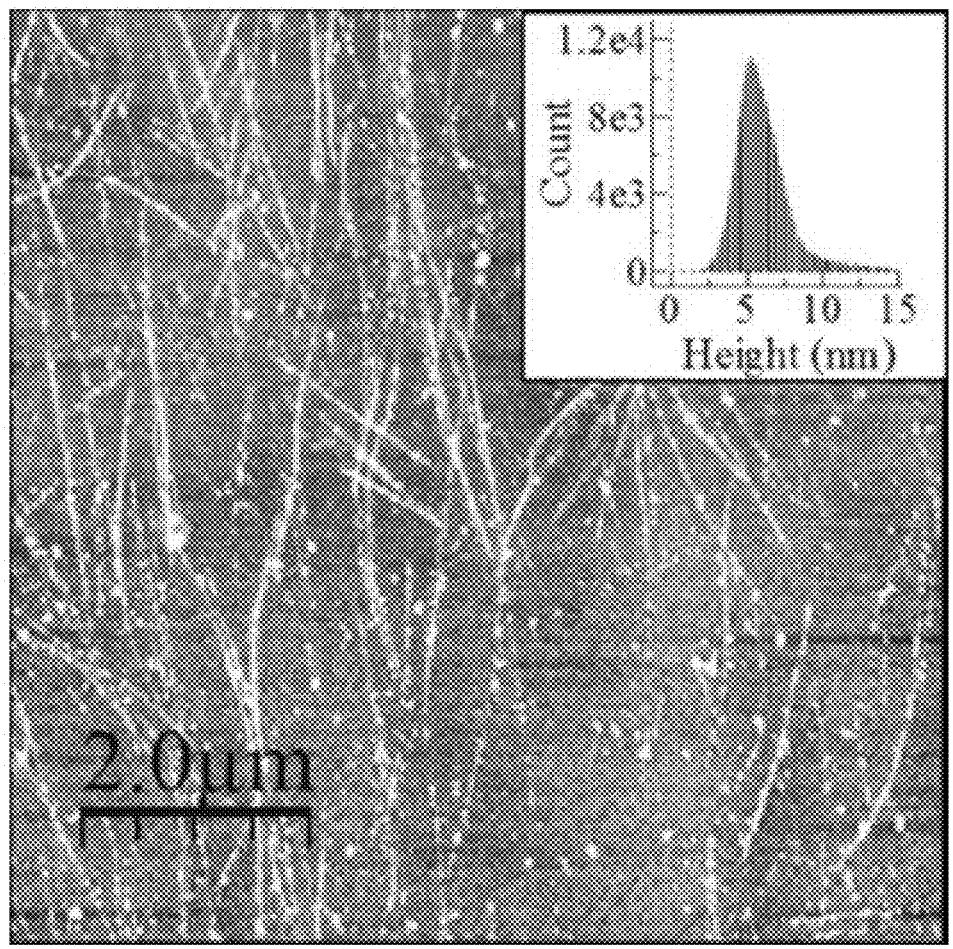
FIG. 6B is an AFM image illustrating that sub-10 nm sized Cu$_2$O nanoparticles were consistently observed on the SWNTs that bridged the source/drain channel between the Ti/TiO$_x$ electrodes.
Figure 6C:
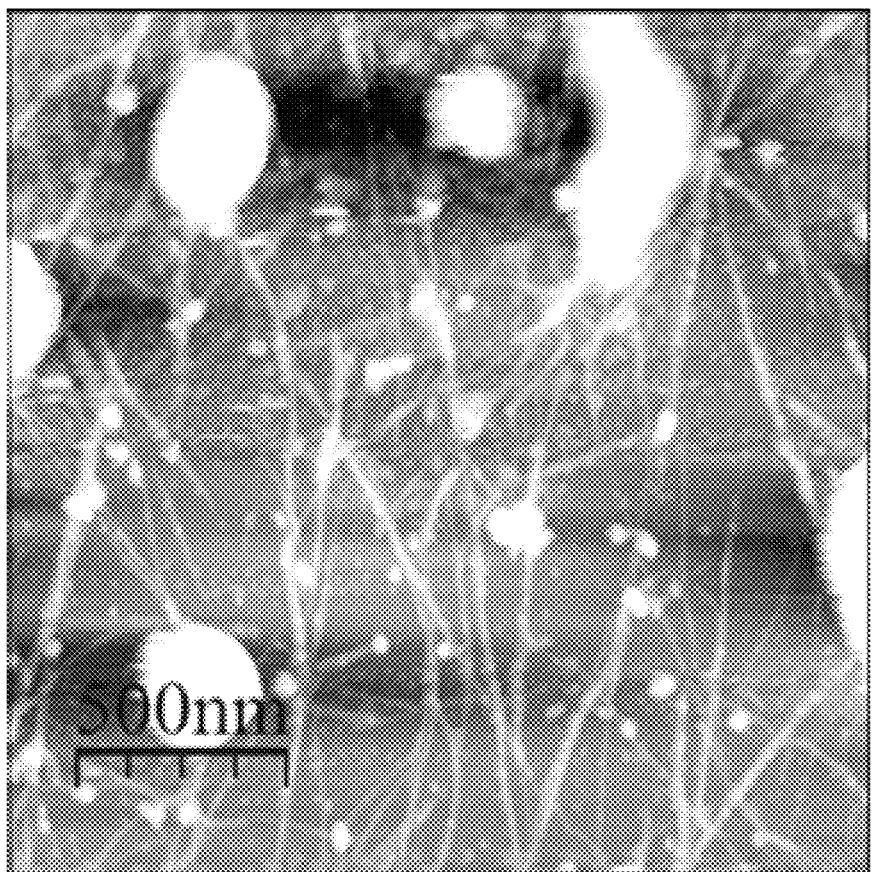
FIG. 6C is a high resolution AFM image showing that the electrodeposited nanoparticles bridge neighboring SWNTs, thus allowing reduced electrical resistance.

The electrode area was confined to a 1.0 cm diameter disc that encompassed the Ti/TiO$_x$ electrodes. This was accomplished by mounting each sample in a homemade glass cell that housed the reference and counter electrodes. Then, the electrochemically active area was defined by the TiO$_x$/silane electrodes and the SWNTs in the macroscopic network that bridged the electrodes (FIG. 6). A deposition charge of 16.7 mC resulted in the growth of nanoparticles on the SWNTs within the network that bridged the source/drain channel. Although they are highly conductive like metals, the sidewalls of SWNTs are inert toward electrochemical deposition of adsorbates. Therefore, deposits generally form via the nucleation and growth of nanoclusters on defects at the ends and sidewalls of the nanotubes. On graphite, this type of preferential nucleation at defects has been attributed to the higher coordination provided by oxygen-containing defects.[63] For SWNTs, the nanoclusters nucleated at defects, and then grew into nm-sized clusters having their size predetermined by the amount of electrochemical charge allowed to pass. Therefore, van der Waals attractions existed between the nanoclusters and sidewalls, while a stronger coordination bond, possibly containing a significant degree of covalent character, existed between the defect and the nanoclusters.

The average height observed for AFM images of unbundled arc discharge SWNTs is 1.4 nm.[30] The average height observed 200 μm from the TiO$_x$/SWNT network interface to 8.5±0.3 nm. The average size of the nanoparticles decreased to 7.3±0.2 nm at 2,000 μm from the $TiO_x$/SWNT network interface. Such a gradient in nanoparticle size is typically observed in SWNT networks,[64,65] as the SWNTs acts as a collection of low-R wires, with high R at each inter-SWNT junction causing a drop in the electrochemical potential with distance. Nanoparticle growth was not observed on isolated SWNTs or the silica substrate, indicating that electrodeposition is an effective manner to preferentially modify the SWNTs in a conductive network.

Effect of $Cu_2O$ Nanoparticles on Electrical Resistance

To determine the effect of $Cu_2O$ nanoparticles on R for low-density networks of unbundled SWNTs, a semiconductor characterization unit was used to measure the two-terminal resistance by obtaining i/V curves in air for the range ±0.1 V. For all electrochemical experiments involving FETs, the amount of $Cu_2O$ deposited was limited by controlling the total charge allowed to flow before the cell was returned to the equilibrium potential, and the sample was removed from the cell. Control experiments, where R was measured before and after samples were immersed in the electrochemical cell and held at potentials near or slightly positive of the equilibrium potential resulted in no appreciable changes in two-terminal R or FET response. However, the magnitude of R was observed to decrease with decreasing deposition potential. Two-point probe R measurements were used, as this configuration closely resembles that of the measurements for the FETs described below.

The change in R was strongly affected by the alignment of the SWNTs in the network. For a deposition potential of 0.1 V vs. Ag/AgCl, the average R decreased from 1.420±0.005 to 0.84±0.02 MΩ for the "aligned" samples, representing a 41% decrease in R. The average R decreased from 1.19±0.06 to 0.132±0.006 MΩ for the "crossbar" samples, corresponding to a 89% reduction in R. Part of the reduction in R for both levels of alignment is attributed to the formation of ohmic contacts between s- and m-SWNTs in the network when nanoparticles bridged those junctions, reducing the Schottky barrier between the two types of conductors. The increased response of the crossbar samples can be attributed to the greater number of inter-SWNT junctions. When high aspect ratio SWNTs were oriented orthogonally, the number of junctions increased significantly. This allowed greater gains in conductivity. The effect of the density of the nanoclusters on the two-terminal R and FET performance of both types of networks is currently under investigation, but it is expected that performance gains will decrease as the density of defects on the SWNTs increases, since sidewall defects impede intra-SWNT current flow.

Figure 7A:
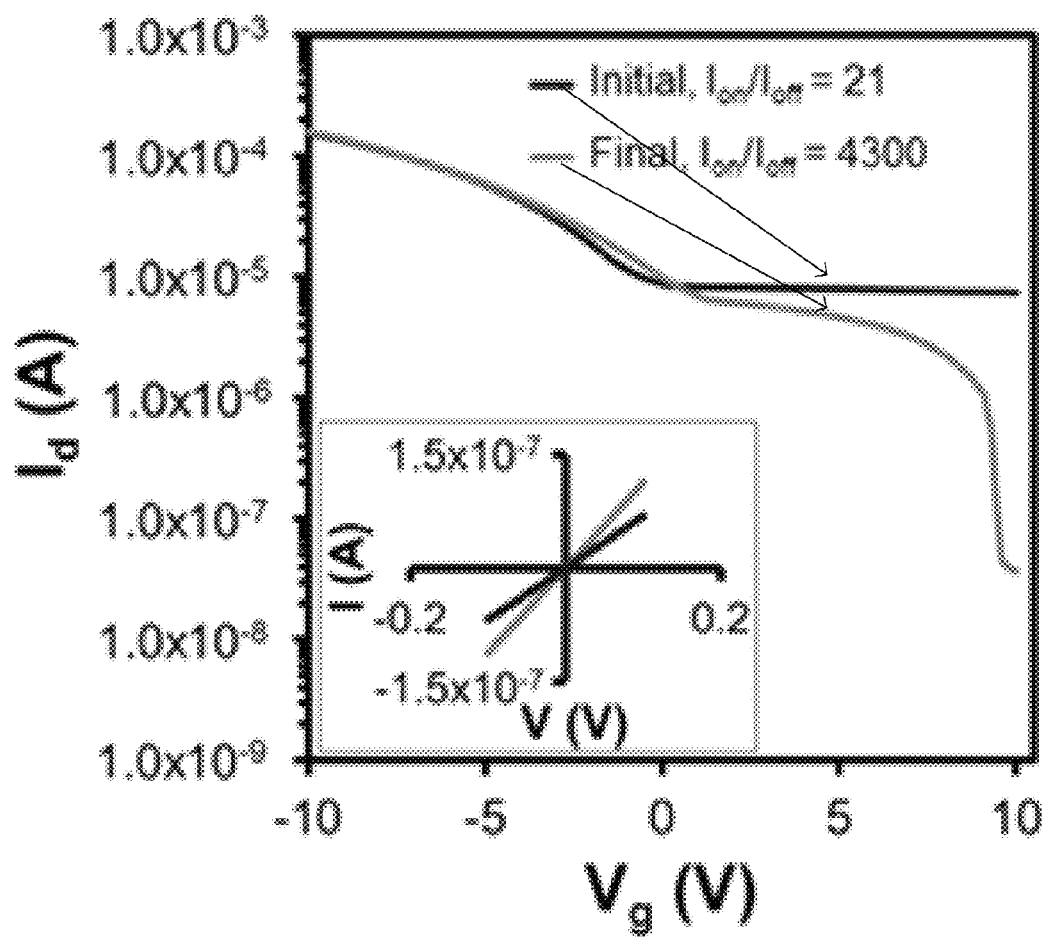
FIGS. 7A-7B illustrate representative log plots showing the dependence of the change in $I_{on}/I_{off}$ on the alignment of SWNTs in the network.
Figure 7B:
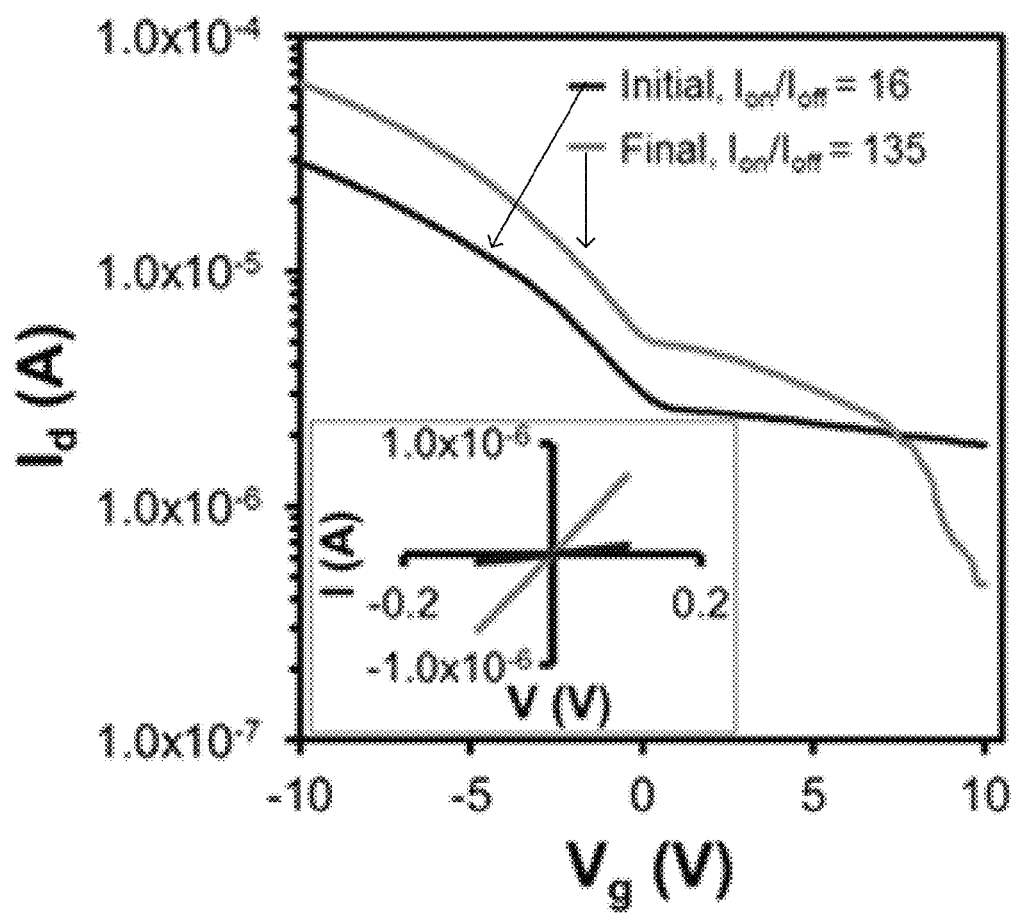

Effect of $Cu_2O$ Nanoparticles on SWNT Network Field-Effect Transistor Performance When the performance of "aligned" and "crossbar" samples were examined in FETs, the "aligned" samples had increased performance gains with respect to $I_{on}/I_{off}$. The magnitude of $I_{on}$ and $I_{off}$ were determined at −10 and +10 V, respectively. After a deposition charge of 2 mC was used to form the nanoclusters, a slight increase in $I_{on}$ and a dramatic decrease in $I_{off}$ were observed. The "aligned" networks consistently had the greatest increase in $I_{on}/I_{off}$. For the representative sample in FIG. 7a, the $I_{on}/I_{off}$ increased from 21 to 4,300, representing a 205-fold increase in $I_{on}/I_{off}$. The "crossbar" networks had a significantly greater initial R, and $I_{on}/I_{off}$ changed from 16 to 135, representing a 8-fold increase. At higher electrochemical charge densities, both the two-terminal R and $I_{on}/I_{off}$ decreased, as the transistor response exhibited increasing metallic behavior for both types of networks. It was also notable that the initial R was higher for "crossbar" networks, although the density of nanotubes for the two networks was similar. This can be attributed to the fewer number of junctions that had to be traversed during electron transport when the SWNTs were partially aligned. This facilitated greater gains in two-terminal R for "crossbar" networks after nanoparticle deposition (FIGS. 7A-7B, insets). On the other hand, the networks composed of partially aligned SWNTs provided fewer electrical pathways between the source and drain electrodes, increasing the efficiency with which the nanoparticle valves could turn off current flow.

As un-separated SWNTs have a distribution of $\frac{1}{3}^{rd}$ metallic and $\frac{2}{3}^{rd}$ semiconductive, low density networks of unbundled nanotubes behave as semiconductors due to the lack of metallic pathways in the network. However, at the higher densities used in these studies, the m-SWNTs formed short circuit pathways that greatly reduced the initial $I_{on}/I_{off}$ SWNT network FETs. Then, the OFF-state current was indicative of the number of metallic pathways through the film. Therefore, starting with FETs that exhibited a low initial $I_{on}/I_{off}$ allowed confirmation of the fact that $Cu_2O$ nanoparticle deposition increased the $V_g$ sensitivity of the m-SWNTs in the conductive pathways. Park et al. have used scanned gate microscopy studies to demonstrate that point defects along m-SWNTs caused resonant electron scattering that resulted in slight sensitivity of the conductance to changes in $V_g$.[66]

Sensitivity to $V_g$ in m-SWNTs is possible because they are not true metals, but in fact semimetals or zero band gap semiconductors, like graphene. Since graphene is a 2-dimensional material, efforts to open a band gap in it have centered on reducing one of its lateral dimensions and/or functionalizing its edges.[67-69] However, the 1-dimensional nature of SWNTs simplifies the process of band gap tuning. The electrodeposition of $Cu_2O$ nanoparticles that increased the local sensitivity of a m-SWNT to $V_g$ essentially inserted a controllable valve along a conducting wire. Therefore, while much of the SWNT continued to exhibit high conductivity in the presence of positive values of $V_g$, electrical transport was halted at each nanoparticle. The mechanism of this likely involved each high work function nanocluster depleting the electron density within a few nm of its location on the m-SWNT, essentially inducing local p-type character in an otherwise metallic or small band gap SWNT. Whenever junctions are formed between two materials with differing Fermi levels, band bending occurs in the valence and conduction bands. Then, the large electric field provided by $V_g$ allows manipulation of this band bending, and the depletion region near the junction, in order to tune the resistance of electron flow throughout the film. A discontinuity in each FET response curve marked the transition between two regions of high slope after the deposition of nanoclusters. It is likely that $V_g$ modulated the carrier charge density in the s-SWNTs at gate voltages that were negative of the discontinuity, while more positive gate voltages turned off conductivity through the nanocluster-modified defect sites in the m-SWNTs.

CONCLUSIONS

Forming SWNT networks on prefabricated metal electrodes using liquid deposition methods provides a facile route to device assembly. This device geometry also facilitated the use of electrochemical methods to enhance the interfacial electron transport by the formation of chemisorbed $Cu_2O$ shunts through a silane monolayer to the conductive underlying Ti. This provides greatly improved connections, compared to the weak van der Waals contacts that exist at unmodified metal/SWNT interfaces. As self-assembled monolayers (SAMs) composed of silane were used as adhesion layers on $SiO_x$ surfaces, the use of metal electrodes that were terminated with a thin oxide layer allowed the formation of a single silane monolayer that coated the entire surface. Then, after network formation, electrochemical methods were used to optimize the electrical properties of the thin films.

Local gating at $Cu_2O$ modified defects on m-SWNTs was obtained, allowing greatly reduced OFF-state currents to be achieved. The great increase in $I_{on}/I_{off}$ for both types of networks indicated that metallic short circuit pathways in the networks were converted to semiconductive, as much of the increase in $I_{on}/I_{off}$ occurred via a greatly reduced $I_{off}$ for FETs that initially showed little response to $V_g$. This indicated that at positive values of $V_g$, the $Cu_2O$ adsorbates opened a band gap in m-SWNTs, and small band gap s-SWNTs, by locally withdrawing electron density. This would effectively allow each nanoparticle/SWNT contact to act as a nanoscale valve that could be closed at positive values of $V_g$, allowing much lower magnitudes of $I_{on}/I_{off}$ to be achieved.

Unlike two-dimensional sheets of graphene, the one-dimensional nature of m-SWNTs provided a unique opportunity to control their electrical properties by simply attaining the capability to tune their conductivity at any one point along the tube axis. Electrodeposited metal oxide nanoclusters functioned as the formation of numerous valves needed to allow a much-enhanced response of the network to $V_g$. This has great potential to increase the operating efficiency of SWNT network-based electronic device structures, overall device performance in greatly improved and less expensive gate dielectrics can be used when the sensitivity to $V_g$ is increased. This approach also reduces the effect of metallic SWNTs in networks without the need for expensive processing steps to separate nanotubes based on their type of conductivity.

REFERENCES

Each of which are Hereby Incorporated by Reference Herein (1) Zhou, X. J.; Park, J. Y.; Huang, S. M.; Liu, J.; McEuen, P. L. *Phys. Rev. Lett.* 2005, 95.
(2) Taychatanapat, T.; Bolotin, K. I.; Kuemmeth, F.; Ralph, D. C. *Nano Lett.* 2007, 7, 652.
(3) Zhou, W.; Zhan, S.; Ding, L.; Liu, J. *J. Am. Chem. Soc.* 2012, 134, 14019.
(4) Yang, X.; Liu, L.; Wu, M.; Wang, W.; Bai, X.; Wang, E. *J. Am. Chem. Soc.* 2011, 133, 13216.
(5) Hong, G.; Zhang, B.; Peng, B.; Zhang, J.; Choi, W. M.; Choi, J.-Y.; Kim, J. M.; Liu, Z. *J. Am. Chem. Soc.* 2009, 131, 14642.
(6) Zhang, L.; Tu, X.; Welsher, K.; Wang, X.; Zheng, M.; Dai, H. *J. Am. Chem. Soc.* 2009, 131, 2454.
(7) Palacin, T.; Le Khanh, H.; Jousselme, B.; Jegou, P.; Filoramo, A.; Ehli, C.; Guldi, D. M.; Campidelli, S. *J. Am. Chem. Soc.* 2009, 131, 15394.
(8) Zhang, L.; Zaric, S.; Tu, X.; Wang, X.; Zhao, W.; Dai, H. *J. Am. Chem. Soc.* 2008, 130, 2686.
(9) So, H. M.; Kim, B.-K.; Park, D.-W.; Kim, B. S.; Kim, J.-J.; Kong, K.-J.; Chang, H.; Lee, J.-O. *J. Am. Chem. Soc.* 2007, 129, 4866.
(10) Byon, H. R.; Choi, H. C. *J. Am. Chem. Soc.* 2006, 128, 2188.
(11) Chen, Z. H.; Appenzeller, J.; Knoch, J.; Lin, Y. M.; Avouris, P. *Nano Lett.* 2005, 5, 1497.
(12) Freitag, M.; Tsang, J. C.; Bol, A.; Yuan, D.; Liu, J.; Avouris, P. *Nano Lett.* 2007, 7, 2037.
(13) Rouhi, N.; Jain, D.; Burke, P. J. *Acs Nano* 2011, 5, 8471.
(14) Caballero-Briones, F.; Artes, J. M.; Diez-Perez, I.; Gorostiza, P.; Sanz, F. *J. Phys. Chem. C* 2009, 113, 1028.
(15) Hu, L.; Hecht, D. S.; Grüner, G. *Chem. Rev.* 2010, 110, 5790.
(16) Yuhas, B. D.; Yang, P. *J. Am. Chem. Soc.* 2009, 131, 3756.
(17) McShane, C. M.; Choi, K.-S. *J. Am. Chem. Soc.* 2009, 131, 2561.
(18) Deng, S.; Tjoa, V.; Fan, H. M.; Tan, H. R.; Sayle, D. C.; Olivo, M.; Mhaisalkar, S.; Wei, J.; Sow, C. H. *J. Am. Chem. Soc.* 2012, 134, 4905.
(19) Yang, F.; Choi, Y.; Liu, P.; Stacchiola, D.; Hrbek, J.; Rodriguez, J. A. *J. Am. Chem. Soc.* 2011, 133, 11474.
(20) Li, C. W.; Kanan, M. W. *J. Am. Chem. Soc.* 2012, 134, 7231.
(21) Huang, W.-C.; Lyu, L.-M.; Yang, Y.-C.; Huang, M. H. *J. Am. Chem. Soc.* 2012, 134, 1261.
(22) Kocabas, C.; Pimparkar, N.; Yesilyurt, O.; Kang, S. J.; Alam, M. A.; Rogers, J. A. *Nano Lett.* 2007, 7, 1195.
(23) Yan, X.; Cui, X.; Li, L.-s. *J. Am. Chem. Soc.* 2010, 132, 5944.
(24) Heller, I.; Chatoor, S.; Männik, J.; Zevenbergen, M. A. G.; Dekker, C.; Lemay, S. G. *J. Am. Chem. Soc.* 2010, 132, 17149.
(25) Lay Marcus, D.; Vichchulada, P.; Asheghali, D. U.S. Patent Appl. 61/733,473, 2012.
(26) Yang, M. H.; Teo, K. B. K.; Milne, W. I.; Hasko, D. G. *Appl. Phys. Lett.* 2005, 87, 3.
(27) Lu, C. G.; An, L.; Fu, Q. A.; Liu, J.; Zhang, H.; Murduck, *J. Appl. Phys. Lett.* 2006, 88, 3.
(28) Fuhrer, M. S.; Nygard, J.; Shih, L.; Forero, M.; Yoon, Y. G.; Mazzoni, M. S. C.; Choi, H. J.; Ihm, J.; Louie, S. G.; Zettl, A.; McEuen, P. L. *Science* 2000, 288, 494.
(29) Nirmalraj, P. N.; Lyons, P. E.; De, S.; Coleman, J. N.; Boland, J. J. *Nano Lett.* 2009, 9, 3890.
(30) Bhatt, N. P.; Vichchulada, P.; Lay, M. D. *J. Am. Chem. Soc.* 2012, 134, 9352.
(31) Zhang, Q.; Vichchulada, P.; Lay, M. D. *J. Phys. Chem. C* 2010, 114, 16292.
(32) Vichchulada, P.; Zhang, Q.; Duncan, A.; Lay, M. D. *ACS Appl. Mater. Interfaces* 2010, 2, 467.
(33) Sangwan, V. K.; Ortiz, R. P.; Alaboson, J. M. P.; Emery, J. D.; Bedzyk, M. J.; Lauhon, L. J.; Marks, T. J.; Hersam, M. C. *Acs Nano* 2012, 6, 7480.
(34) Zhang, Q.; Vichchulada, P.; Cauble, M. A.; Lay, M. D. *J. Mater. Sci.* 2009, 44, 1206.
(35) Li, E. Y.; Marzari, N. *Acs Nano* 2011, 5, 9726.
(36) Zhang, Y.; Franklin, N. W.; Chen, R. J.; Dai, H. J. *Chem. Phys. Lett.* 2000, 331, 35.
(37) Rodriguez-Manzo, J. A.; Banhart, F.; Terrones, M.; Terrones, H.; Grobert, N.; Ajayan, P. M.; Sumpter, B. G.; Meunier, V.; Wang, M.; Bando, Y.; Golberg, D. *Proc. Natl. Acad. Sci. USA* 2009, 106, 4591.
(38) Zhang, Y.; Ichihashi, T.; Landree, E.; Nihey, F.; Iijima, S. *Science* 1999, 285, 1719.
(39) Asaka, K.; Karita, M.; Saito, Y. *Appl. Surf. Sci.* 2011, 257, 2850.
(40) Madsen, D. N.; Mølhave, K.; Mateiu, R.; Rasmussen, A. M.; Brorson, M.; Jacobsen, C. J. H.; Bøggild, P. *Nano Lett.* 2002, 3, 47.
(41) Zhang, Q.; Vichchulada, P.; Shivareddy, S. B.; Lay, M. D. *J. Mat. Sci.* 2012, 47, 6812.

(42) Chow, B. Y.; Mosley, D. W.; Jacobson, J. M. *Langmuir* 2005, 21, 4782.
(43) Vichchulada, P.; Cauble, M. A.; Abdi, E. A.; Obi, E. I.; Zhang, Q.; Lay, M. D. *J. Phys. Chem. C* 2010, 114, 12490.
(44) Horcas, I.; Fernandez, R.; Gomez-Rodriguez, J. M.; Colchero, J.; Gomez-Herrero, J.; Baro, A. M. *Rev. Sci. Instrum.* 2007, 78.
(45) Savio, A. K. P. D.; Starikov, D.; Bensaoula, A.; Pillai, R.; de la Torre Garcí a, L. L.; Robles Hernández, F. C. *Ceram. Int.* 2012, 38, 3529.
(46) Lee, M.-K.; Yen, C.-F. *Electrochem. Solid St.* 2010, 13, G87.
(47) Basame, S. B.; White, H. S. *Anal. Chem.* 1999, 71, 3166.
(48) Boxley, C. J.; White, H. S.; Gardner, C. E.; Macpherson, J. V. *J. Phys. Chem. B* 2003, 107, 9677.
(49) Rao, C. N. R.; Subba Rao, G. V. *Phys. Status Solidi* 1970, 1, 597.
(50) Emery, S. B.; Hubbley, J. L.; Roy, D. *J. Electroanal. Chem.* 2004, 568, 121.
(51) Oskam, G.; Searson, P. C. *Surf. Sci.* 2000, 446, 103.
(52) Casillas, N.; Charlebois, S.; Smyrl, W. H.; White, H. S. *J. Electrochem. Soc.* 1994, 141, 636.
(53) Scharifker, B.; Hills, G. *Electrochim. Acta* 1983, 28, 879.
(54) Liu, R.; Oba, F.; Bohannan, E. W.; Ernst, F.; Switzer, J. A. *Chem. Mater.* 2003, 15, 4882.
(55) Zhao, L.; Dong, W.; Zheng, F.; Fang, L.; Shen, M. *Electrochim. Acta* 2012, 80, 354.
(56) Wu, S.; Yin, Z.; He, Q.; Lu, G.; Zhou, X.; Zhang, H. *J. Mater. Chem.* 2011, 21, 3467.
(57) Basu, M.; Sinha, A. K.; Pradhan, M.; Sarkar, S.; Negishi, Y.; Pal, T. *J. Phys. Chem. C* 2011, 115, 20953.
(58) Banus, M. D.; Reed, T. B.; Strauss, A. J. *Phys. Rev. B* 1972, 5, 2775.
(59) Vandenberg, E. T.; Bertilsson, L.; Liedberg, B.; Uvdal, K.; Erlandsson, R.; Elwing, H.; Lundstrom, I. *J. Colloid Interface Sci.* 1991, 147, 103.
(60) Laitinen, H. A.; Kolthoff, I. M. *J. Am. Chem. Soc.* 1939, 61, 3344.
(61) Bard, A. J.; Faulkner, L. R. *Electrochemical Methods, Fundamentals and Applications;* 2nd ed.; John Wiley & Sons: New York, 2001.
(62) Fan, Y. W.; Goldsmith, B. R.; Collins, P. G. *Nat. Mater.* 2005, 4, 906.
(63) Walter, E. C.; Murray, B. J.; Favier, F.; Kaltenpoth, G.; Grunze, M.; Penner, R. M. *J. Phys. Chem. B* 2002, 106, 11407.
(64) Dudin, P. V.; Snowden, M. E.; Macpherson, J. V.; Unwin, P. R. *Acs Nano* 2011, 5, 10017.
(65) Day, T. M.; Wilson, N. R.; Macpherson, J. V. *J. Am. Chem. Soc.* 2004, 126, 16724.
(66) Bockrath, M.; Liang, W. J.; Bozovic, D.; Hafner, J. H.; Lieber, C. M.; Tinkham, M.; Park, H. K. *Science* 2001, 291, 283.
(67) Yang, Z.; Sun, Y.; Alemany, L. B.; Narayanan, T. N.; Billups, W. E. *J. Am. Chem. Soc.* 2012, 134, 18689.
(68) Schwab, M. G.; Narita, A.; Hernandez, Y.; Balandina, T.; Mali, K. S.; De Feyter, S.; Feng, X.; Muellen, K. *J. Am. Chem. Soc.* 2012, 134, 18169.
(69) Balog, R.; Jorgensen, B.; Wells, J.; Laegsgaard, E.; Hofmann, P.; Besenbacher, F.; Hornekaer, L. *J. Am. Chem. Soc.* 2009, 131, 8744.

We claim:

1. A structure comprising:
   a substrate,
   a network of single-walled carbon nanotubes (SWCNTs), wherein the SWCNTs are substantially aligned, or, alternatively, wherein the SWCNTs are oriented in a crossbar formation with the SWCNTs at least partially orthogonally distributed, wherein the orientation of the SWCNTs is controlled by the direction of a unidirectional stream of nitrogen during successive drying cycles, and
   a plurality of quantum dots (QDs) on the network of SWCNT, wherein the quantum dots are in contact with the SWCNTs in the network providing a SWCNT/QD network.

2. The structure of claim 1, further comprising an adhesion layer between the substrate and the network of SWCNTs, wherein the adhesion layer is a self-assembled monolayer.

3. The structure of claim 2, wherein the adhesion layer comprises a material selected from the group consisting of: silane, a silanization agent, a thiol, a phosphate, a sulfide, a disulfide, a phosphonate, and a combination thereof.

4. The structure of claim 1, wherein the substrate is selected from the group consisting of glass and a silicon-based substrate.

5. The structure of claim 1, wherein the quantum dot comprises a nanoparticle or nanocluster of a semiconductor material.

6. The structure of claim 1, wherein the quantum dot comprises a nanoparticle or nanocluster of a Cu oxide.

7. The structure of claim 6 wherein the Cu oxide is selected from the group consisting of CuO, $Cu_2O$, and a combination thereof.

8. The structure of claim 1, wherein the SWCNTs are at least partially aligned in the network.

9. The structure of claim 1, wherein the SWCNTs are at least partially orthogonally distributed within the network.

10. The structure of claim 1, wherein the SWCNT is selected from the group consisting of a semiconductive SWCNT, metallic SWCNT, and a combination thereof.

11. The structure of claim 1, further comprising an electrode, wherein the electrode is in direct or indirect contact with at least one SWCNT in the network.

12. The structure of claim 11, wherein the electrode is at least partially coated with an adhesion layer.

13. The structure of claim 11 wherein the electrode comprises a material selected from the group consisting of: Ti, Al, Ta, Ni, Fe, and a combination thereof.

14. The structure of claim 13 wherein the electrode comprises titanium and further comprises a titanium oxide selected from the group consisting of $TiO_2$, $Ti_2O_3$, and titanium oxides with a Ti/O ratio of about 0.8 to about 1.7.

15. A field effect transistor (FET) comprising:
   a substrate,
   an electrode,
   a network of single-walled carbon nanotubes (SWCNTs), wherein the SWCNTs are substantially aligned, or, alternatively, wherein the SWCNTs are oriented in a crossbar formation with the SWCNTs at least partially orthogonally distributed, wherein the orientation of the SWCNTs is controlled by the direction of a unidirectional stream of nitrogen during successive drying cycles, and
   a plurality quantum dots disposed on the network of SWCNTs, wherein the quantum dots are in contact with the SWCNTs in the network, providing a SWCNT/QD network.

16. The FET of claim 15, further comprising an adhesion layer between the substrate and the network of SWCNTs.

17. A method of making a device comprising:
providing a substrate;
forming a network of single-walled carbon nanotubes (SWCNTs) on the substrate, forming the network of SWCTNs comprising:
  contacting the substrate with a composition comprising SWCNTs;
  drying the substrate in a unidirectional stream of nitrogen ($N_2$), wherein the direction of nitrogen during drying is the same for each cycle to produce a network wherein the SWCNTs are substantially aligned, or, alternatively, wherein the direction of nitrogen during drying is changed for each cycle to produce a network wherein the SWCNTs are oriented in a crossbar formation wherein the SWCNTs are at least partially orthogonally distributed;
  rinsing the surface with water; and
  repeating the above steps for a number of cycles until a network of SWCNTs is formed on the substrate; and
depositing a plurality of semiconductive quantum dots on the network of SWCNTs to form a SWCNT/QD network.

18. The method of claim 17, further comprising depositing an adhesion layer on the substrate, wherein the adhesion layer is a self-assembling monolayer.

19. The method of claim 18, wherein depositing the adhesion layer comprises exposing the substrate to a silanization agent.

20. The method of claim 17, further comprising depositing at least one electrode on the surface of the substrate before or after formation of the network of SWCNTs on the substrate.

21. The method of claim 20, further comprising depositing an adhesion layer on the substrate and at least partially on the electrode before deposition of the network of SWCNTs.

22. The method of claim 17, wherein depositing a plurality of semiconductive quantum dots on the network of SWCNTs comprises depositing the quantum dots by electrodeposition or chemical vapor deposition.

23. The method of claim 17, wherein the quantum dots comprise a copper oxide, and wherein the quantum dots are deposited by electrodeposition of $Cu^{2+}$ on the network of SWCNTs.

24. A method of increasing an ON-STATE/OFF-STATE ratio of a field effect transistor (FET) having a network of single-walled carbon nanotubes (SWCNTs) comprising:
  depositing a plurality of semiconductive quantum dots on the network of SWCNTs, wherein the quantum dots act as Vg-tunable Schottky contacts reducing OFF-STATE of the FET in a Vg range +/−5V, wherein the SWCNTs in the network are substantially aligned, or, alternatively, wherein the SWCNTs in the network are oriented in a crossbar formation with the SWCNTs at least partially orthogonally distributed, wherein the orientation of the SWCNTs is controlled by a direction of unidirectional stream of nitrogen during successive drying cycles.

\* \* \* \* \*